United States Patent [19]
Rudder et al.

[11] Patent Number: 5,480,686
[45] Date of Patent: Jan. 2, 1996

[54] PROCESS AND APPARATUS FOR CHEMICAL VAPOR DEPOSITION OF DIAMOND FILMS USING WATER-BASED PLASMA DISCHARGES

[75] Inventors: Ronald A. Rudder, Wake Forest; George C. Hudson, Clayton; Robert C. Hendry, Hillsborough; Robert J. Markunas, Chapel Hill; Michael J. Mantini, Raleigh, all of N.C.

[73] Assignee: Research Triangle Institute, Research Triangle Park, N.C.

[21] Appl. No.: 151,184

[22] Filed: Nov. 12, 1993

Related U.S. Application Data

[63] Continuation-in-part of Ser. No. 61,291, May 14, 1993, Pat. No. 5,418,018, which is a continuation of Ser. No. 787,891, Nov. 5, 1991, abandoned.

[51] Int. Cl.⁶ ........................................................ B05D 3/06
[52] U.S. Cl. ........................... 427/562; 427/577; 427/575; 427/571; 427/122; 423/466
[58] Field of Search .................................. 427/450, 561, 427/562, 575, 577, 249, 571, 590, 122; 423/446

[56] References Cited

U.S. PATENT DOCUMENTS

| | | | |
|---|---|---|---|
| 4,262,631 | 4/1981 | Kubacki . | |
| 4,795,880 | 1/1989 | Hayes et al. . | |
| 4,810,935 | 3/1989 | Boswell . | |
| 4,844,775 | 7/1989 | Keeble . | |
| 5,023,109 | 6/1991 | Chin et al. | 427/577 |
| 5,110,405 | 5/1992 | Sawabe et al. | 427/577 |
| 5,110,577 | 5/1992 | Tamor et al. | 427/249 |
| 5,124,179 | 6/1992 | Garg et al. | 427/587 |
| 5,142,390 | 8/1992 | Ohta et al. | 423/446 |
| 5,175,021 | 12/1992 | Bonsaver et al. . | |
| 5,217,700 | 6/1993 | Kurihara et al. | 427/450 |
| 5,230,931 | 7/1993 | Yamazaki et al. | 427/571 |
| 5,268,201 | 12/1993 | Aomaki et al. | 427/577 |
| 5,275,798 | 1/1994 | Aida | 427/577 |

FOREIGN PATENT DOCUMENTS 62-180060  7/1987  Japan .

OTHER PUBLICATIONS

Rudder et al. "Chem Vap. dip. of diamond films from water vapor r.f.–plasma discharges", *Appl. Phys. Lett.* 60(3), 20 Jan. 1992 pp. 329–331.

T. R. Anthony, "Synthesis of Metastable Diamond", Mat. Res. Soc. Symp. Proc., vol. 162, pp. 61–83 (1990) no month.

Bachmann et al., "Diamond and Related Materials", vol. 1, (List continued on next page.)

*Primary Examiner*—Marianne Padgett
*Attorney, Agent, or Firm*—Oblon, Spivak, McClelland, Maier, & Neustadt

[57] ABSTRACT

A chemical vapor deposition (CVD) process and apparatus for the growth of diamond films using vapor mixtures of selected compounds having desired moieties, specifically precursors that provide carbon and etchant species that remove graphite. The process involves two steps. In the first step, feedstock gas enters a conversion zone. In the second step, by-products from the conversion zone proceed to an atomization zone where diamond is produced. In a preferred embodiment a feedstock gas phase mixture including at least 20% water which provides the etchant species is reacted with an alcohol which provides the requisite carbon precursor at low temperature (55°–1100° C.) and low pressure (0.1 to 100 Torr), preferably in the presence of an organic acid (acetic acid) which contributes etchant species reactant. In the reaction process, the feedstock gas mixture is converted to $H_2$, CO, $C_2H_2$, no $O_2$, with some residual water. Oxygen formerly on the water is transferred to CO. Hence, an etchant species ($H_2O$, OH, O) is replaced in the reactor by CO, a growth species and prevents undesirous consumption of diamond (the net-product). In a preferred embodiment, the apparatus assures conversion by preventing gas circumvention of the conversion zone prior to dissociation in the hydrogen atomization zone to produce the necessary atomic hydrogen for diamond growth.

46 Claims, 16 Drawing Sheets

OTHER PUBLICATIONS

No. 1, Aug. 15, 1991, Towards a general concept of diamond chemical vapour deposition.

W. A. Yarbrough, "Thermodynamics and the CVD of Diamond", Mat. Res. Soc. Symp. Proc. vol. 162, pp. 75–83, (1990) no month.

Hata et al., "Plasma Etching of Diamond Films", *New Diamond* No. 2, pp. 32–34 (Apr. 1990).

L. M. Hanssen et al., "Diamond Synthesis Using An Oxygen–Acetylene Torch", *Materials Letters,* vol. 7, No. 7,8, pp. 289–292, Dec. 1988.

Y. Hirose, "Combustion Flame Diamond Coating Method (Hirose Method); from its Birth to the Present", *Materials Science Monographs,* 73, p. 471, no month (1991).

Saito et al, "Diamond Synthesis from Methan–hydrogen–water mixed gas using microwave plasma" *J. Mat. Sci.* 23, pp. 842–844, (1988) no month.

Saito et al., "Diamond Synthesis from $CO-H_2$ mixed gas plasma", *J. of Mat. Sci.* 25, pp. 1246–1250 (1990) no month.

K. Aoyama et al., "Diamond deposition with $Ar-CO_2-CH_4-H_2$ plasma jets", *Diamond and Related Materials,* 2 pp. 337–341, (1993) no month.

T. Kawato et al., "Effects of Oxygen on CVD Diamond Synthesis", *Jap. J. Appl. Phys.* vol. 26, No. 9, pp. 1429–1432, 9 Sep. 1987.

Matsumoto, "Development of DVD Diamond Synthesis Techniques", *Proceedings of the 1st Internat. Symposium on Diamond & Diamond–like Films,* The Electrochemical Society, vol. 89–12, pp. 50–54, (1989) no month.

Chen et al., "An investigation of diamond growth on ferrous metals", *Materials Science Monograph,* 73, pp. 137–142, (1991) no month.

Amorim et al., "High–density plasma mode of an inductively coupled . . . ", J. Vac. Sci. Technol. B9(2), pp. 362–365, Mar./Apr. 1991.

Lede et al., "Production of Hydrogen by Direct Thermal Decomposition . . . ", Int. J. Hydrogen Energy, vol. 7, No. 12, pp. 939–950, (1982) no month.

Komiyama, "Tokyo University Researchers Synthesize Diamond Film at . . . ", *Diamond Depositions: Science and Technology,* p. 15, Aug. 1991.

S. Pang et al., "Thermal desorption measurements of aluminum alloy . . . ", *J. Vac. Sci. Technol. A,* vol. 5, No. 4, pp. 2516–2519, Jul./Aug. 1987.

15 μm

5 μm

PROCESS AND APPARATUS FOR CHEMICAL VAPOR DEPOSITION OF DIAMOND FILMS USING WATER-BASED PLASMA DISCHARGES

The U.S. Government has a paid-up license in this invention and the right to limited circumstances to require the patent owner to license others on reasonable terms as provided for by the terms of contract #N00014-86-C-0460 awarded by the Office of Naval Research. This application is a continuation-in-part of application Ser. No. 08/061,291 filed May 14, 1993, now U.S. Pat. No. 5,418,018 which is a continuation of Ser. No. 07/787,891 filed Nov. 5, 1991, now abandoned.

BACKGROUND OF THE INVENTION

1. Field of the Invention

This invention relates to a process and apparatus for chemical vapor deposition of diamond films.

2. Discussion of the Background

Deposition of diamond films using CVD techniques has been well established. Numerous workers have used a plethora of techniques and source gases for diamond growth (see T. R. Anthony in Mat. Res. Soc. Symp. Proc. 162, 61 (1990) or see also P. K. Bachmann et al. in Diamond and Related Materials 1,1 (1991)). The techniques have included microwave-plasma assisted, hot filament assisted, dc plasma assisted, arc-jet discharges, rf plasma assisted, and oxy-acetylene-torch CVD techniques. The vast majority of the work depends on molecular hydrogen dissociation/activation in high-temperature plasma regions or in equivalent high temperature regions such as a hot filament or an oxy-acetylene torch. As a consequence of the sample temperature being much lower than the source temperature, there exists a super equilibrium of atomic hydrogen at the diamond growth surface. Thus, diamond growth proceeds once a sufficient amount of atomic hydrogen is produced.

One role of the atomic hydrogen is to dissolve any graphite from the depositing diamond layer. Some of the earliest and simplest theories of diamond growth hypothesized that diamond CVD growth was a codeposition process involving the deposition of both graphite and diamond but in which the graphite was dissolved preferentially, resulting in stabilization of the diamond phase. Thus, providing an effective graphite etchant to dissolve graphite from a depositing diamond layer is critical in any diamond CVD process.

Another role of the atomic hydrogen is to promote diamond formation through stabilization of the surface of diamond. Additional insight into the thermodynamics of diamond deposition has been provided by W. A. Yarbrough whose quasi-equilibrium calculations have shown that, at high fractions of atomic hydrogen (greater than 0.1%), diamond condensation is preferred over graphite (see W. A. Yarbrough in Mat. Res. Soc. Symp. Proc. 192, 775 (1990)). Hence, diamond deposition techniques need to generate a high fraction of atomic hydrogen to insure diamond promotion over graphite. In addition, with the deposition process involving carbon atom addition per unit time, the deposition process must also provide a critical absolute atomic hydrogen flux per unit time in order to stabilize the instantaneous growth surface.

Many hydrocarbon, halo carbon, fluorocarbon, and organic sources have been used to produce diamond films. Typically, the promotion of diamond bonding over graphitic bonding is only accomplished when the percentage of hydrocarbon in the gas phase is small. A molecular hydrogen concentration insures high atomic H concentrations in the diamond growth systems. Thus, any graphite deposited by a particular technique can be dissolved before graphitic phases can be incorporated into the diamond. Correspondingly, the best films are deposited with hydrocarbon percentages between 0.5–2.0%. Films deposited at higher hydrocarbon concentrations show little if any evidence of diamond bonding from Raman analysis (see Hata and Sato in New Diamond, 32–34 (1990)).

For a number of reasons, workers have sought to alter, to modify, or to change the diamond process from a molecular-hydrogen based process. Workers have sought other sources of atomic hydrogen and have sought other graphite etchants (see T. R. Anthony, Mat. Res. Soc. Symp Proc. 162, 61 (1990)). Variations from the traditional 95–99% $H_2$ with 1–5% $CH_4$ feed gasses with F, Cl, O, and OH additives have been accomplished.

Of the variety of techniques for diamond growth which have been attempted for diamond growth, only the oxy-acetylene flames have had substantial success in the growth of high quality diamond films without the use of molecular hydrogen addition. Growth of diamond from oxy-acetylene flames has been accomplished using a 1:1.05 mix of $O_2$ to $C_2H_2$ as the premix entering the combustion flame (see L. M. Hansen et al. in Mater. Letters 7, 289 (1988)). In an oxy-acetylene flame, oxygen ($O_2$) and acetylene ($C_2H_2$) are spontaneously reacted in a chemical flame. Similar to the microwave plasma diamond growth, the chemical flame is at an extremely high temperature 3000° C. At those temperatures, the reactants ($O_2$ and $C_2H_2$) and the burn products ($CO$, $CO_2$, $H_2O$) are in a partially dissociated state such that atomic H is readily available to the diamond growth surface. The oxy-acetylene flames which produce diamond burn "rich". The position of substrate in the flame has always been inside the primary flame where $H_2$ and CO are present. Diamond growth in the secondary flame containing $H_2O$ and $CO_2$ has not been observed. The secondary flame is an oxidizing atmosphere. Y. Hirose (Applications of Diamond Films and Related Materials, Materials Science Monograph 73, 471 (1991)) has pointed out that "the combustion flame comprises two areas, one being an oxidizing area called the 'outer flame' (oxidizing one) and the other being a reducing area called 'inner flame' (reducing one)." Furthermore, Hirose states that "it is a well known experimental fact that a key point to successful diamond synthesis is to produce a radical which is made in a reducing plasma."

O and OH chemistries have been also exploited in both plasma-assisted and hot-filament techniques. For example, small quantities of oxygen and water vapor have been added to microwave plasma reactors for the purpose of oxygen addition. Small percentages (0.5–2%) of oxygen and small percentages of water vapor (0–6%) improve the Raman spectra and decrease the temperature at which diamond deposits (see Saito et al. in J. Mat. Sci. 23, 842 (1988) or Saito in J. Mat. Sci. 25, 1246 (1990)). However, higher percentages have been observed to degrade the diamond quality. Likewise, Aoyama et al (Diamond and Related Materials 2, 337 (1993)) reports that, for plasma jet systems, "Small amounts of oxygen contained in the plasma jet promote the purification of deposited diamond. However, larger amounts of oxygen atoms or molecules react with diamond, and the deposition of diamond is suppressed."

Workers experimenting with hot-filament apparatus have reached the same basic conclusions. Kawato and Kondo (Jap. J. Appl. Phys 26, 1429 (1987)) have shown that the deposition of non-diamond phases is suppressed so that the quality of diamond is improved when small amounts of oxygen are added (less than 4%). However, Matsumoto (Proceedings of the Electrochemical Society 89-12, 50 (1989)) cautions not to use a "heated filament in an atmosphere of high oxygen content." Furthermore, Matsumoto states that "oxygen concentrations higher than 33% burn off the hot filament."

Indeed, high percentages of oxygen as $O_2$, OH, or O are deleterious to many CVD diamond growth systems. Systems which use hot-filaments or hot metal fixtures (such as arc discharges) are particularly susceptible to metallic erosion. Materials such as W, Mo, Tn, Rh form volatile metallic oxides which sublime in the vacuum system. This sublimation limits the lifetime of the apparatus as well as contributing to metal contamination in the diamond film. Indeed, H. Chen et al. reported that the lifetime of a W filament is reduced when oxygen concentrations exceed 1% (H. Chen et al. Applications of Diamond Films and Related Materials, Materials Science Monograph 73, 137 (1991)). However, Komaki and Hirose (Jap. Pat. Kokai Sho 62 [1987]-180060) have reported the growth of diamond-like carbon and/or diamond using high concentrations of water across a heated W filament.

In general, oxygen is a very reactive gas with a broad spectrum of materials. Once the temperature of the material exceeds the oxidation temperature of the material, the material is either converted to a stable oxide, or the material sublimes. Two examples are given. First, elemental tungsten is an extremely robust high temperature material in vacuum or in an inert atmosphere. Tungsten melts at 2900° C. However, in an oxidizing atmosphere (such as an environment containing significant $O_2$, or $H_2O$), tungsten forms a volatile oxide which sublimes at 800° C. and melts at 1500° C. Second, carbon is also an extreme high temperature material which melts at temperatures greater than 3000° C. Carbon is rapidly oxidized at 800° C. Diamond, graphite, coals, and other forms of carbon all react with $H_2O$ and $O_2$ to form CO at temperatures of 700°–900° C.

Hence, the distinct problem associated with the growth of diamond from feed stock containing a high oxygen content is the amount of reactive oxygen ($O_2$, O, $H_2O$, or OH) existing at the diamond growth surface.

SUMMARY OF THE INVENTION

Accordingly, one object of the invention is to provide a new and improved process and apparatus for CVD diamond deposition which overcome the problems of prior art techniques caused by reactive oxygen.

A further object of this invention is to provide a new and improved process and apparatus which supplies the carbon source for diamond growth in a water-based process from simple alcohols and hydrocarbons: the alcohols providing the distinct advantage of being miscible in water. Note that the same feed stock percentages are available by separate metering of the reactants.

Yet a further object of this invention is to produce diamond films using inexpensive, environmentally benign materials such as water without invoking diamond growth contamination or lifetime reduction from reactive oxygen etching.

Still a further object of this invention is to provide a simple, industrially safe process and apparatus for producing diamond films.

These and other objects are achieved according to the practice by providing a new and improved process and apparatus for water-based diamond growth that incorporates feed stock conversion in which oxygen residing on the water (a diamond etchant species) is neutralized by oxygen transfer to CO (a diamond growth species). The feed stock conversion produces predetermined species $H_2$, $CH_4$, CO, $C_2H_2$ with some residual $H_2O$. Under conditions of diamond growth, no $O_2$ species are generated by the conversion zone or the atomization zone. Carbon supplied to the system complexes with available O or OH before $O_2$ is produced. These gases de facto become the gaseous feed to the hydrogen atomization zone where sufficient generation of atomic H insures diamond growth. The process and apparatus does not allow circumvention of the parent feed stock gas. Therefore, only a small residual amount of water and substantially no $O_2$ is produced in the hydrogen atomization zone, resulting in high quality diamond growth.

The present invention provides a method for diamond growth which utilizes high concentrations of water as a feed stock gas and avoids exposure of the diamond growth surface to reactive oxygen. It prescribes a method for the growth of diamond from feed stock gasses rich in water wherein oxygen is transferred from reactive species to CO thus reducing the reactive oxygen concentration at the growth surface. The principle by product of water decomposition is $O_2$. In the present invention, CO production intercedes. This intercession occurs only when enough carbon atoms are supplied to the gas phase to prevent $O_2$ generation. Water as an oxidizer is replaced in the gas stream by H2 and CO. Oxygen originally residing on the water molecule is transferred to CO. CO unlike $O_2$, OH, or O is non-oxidizing and is a growth species. Thus, the current invention while starting with a feed stock mixture too rich in reactive oxygen supplies to the diamond growth surface a converted feed stock with a small reactive oxygen concentration containing substantially no $O_2$.

Diamond growth is accomplished according to the present invention by a two-step process. First, the feed stock gasses with proper percentages of water and alcohol transit a conversion zone wherein oxygen transference to CO occurs. Second, the converted feed stock is introduced to a hydrogen atomization zone wherein sufficient generation of atomic hydrogen occurs to yield diamond.

Thus, as recognized according to the present invention, the water process is highly dependent on conversion of the water-based species in the feed stock to $H_2$ and CO. Accordingly, the conversion process of the present invention produces in situ molecular $H_2$, CO, and hydrocarbon species such as $C_2H_2$. It has been discovered by the present inventors that diamond growth requires that the feed stock supply is rich enough in carbon both to intercede the $O_2$ production and to produce $C_2H_2$. Residual water (unconverted) remains in the gas stream. The concentration of gas phase reactive oxygen ($O_2$, $H_2O$, OH, O) in the present invention is comparable to the levels of oxygen practiced by the aforementioned authors using $O_2$ or $H_2O$ addition to molecular-hydrogen-based feed stock.

Accordingly, the present invention provides a new and improved process for the CVD growth of polycrystalline and homoepitaxial diamond films, which admits vapors of water and alcohol into a low pressure electric discharge to produce diamond growth. The process does not rely on molecular hydrogen dilution. Addition of molecular hydrogen to the plasma discharge is not necessary for high quality diamond growth.

One aspect of the present invention is the conversion of the water-based solutions to $H_2$, CO, $C_2H_2$, $CH_4$, and a small amount of residual $H_2O$, a predetermined feed stock gas combination. The conversion creates (in situ) gases which commonly are introduced to the diamond growth reactors from compressed sources. In one embodiment, the conversion zone is remote from the chamber in which diamond deposition occurs. Otherwise, the conversion occurs within the chamber. In either case, the present invention establishes the requisite conditions so that oxygen atoms and OH liberated from the water molecule complex with available carbon to form CO molecules prior to diamond deposition.

Thus, another aspect of the preferred embodiment of the invention is the existence of a conversion zone through which all gas must traverse. Circumvention of the conversion zone results in untransferred oxygen (O, OH, or $O_2$) available at the diamond growth surface to chemically etch the diamond or available at hot metal surfaces to etch the metallic fixtures. Hot-filament and arc discharge systems are particularly susceptible to insufficient conversion due to gas circumvention of the high temperature zone. Practice of the present invention in those systems requires conversion of the gas stream prior to its passage by a hot-filament or an arc-jet system.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 17 is a Quadrupole mass spectrum showing nearly entire conversion of the water/methanol mixture as the mixture flows through the apparatus depicted in FIG. 14 with the rf plasma on.

DESCRIPTION OF THE PREFERRED EMBODIMENTS

Figure 1:
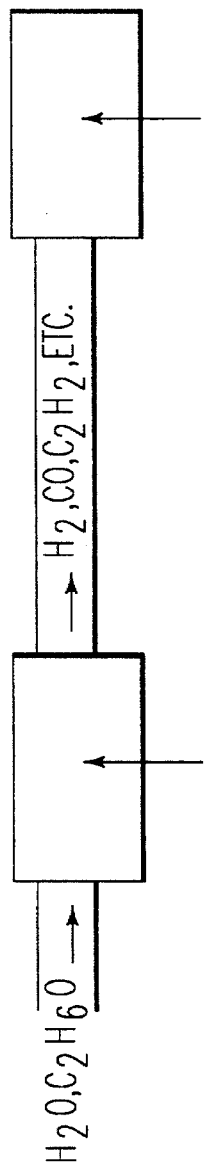
FIG. 1 is a schematic illustration of the process of the invention.

Referring now to the drawings, wherein like reference numerals designate identical or corresponding parts throughout the several views, and more particularly to FIG. 1 thereof, a generic schematic of the invention process is given. FIG. 1 shows that parent water-based feedstocks first enter a conversion zone (1). Output from the conversion zone is a predetermined mix of gas containing $H_2$, CO, $C_2H_2$, other hydrocarbons, some residual $H_2O$, and substantially no $O_2$. This converted gas stream then feeds a hydrogen atomization zone (2). To avoid undesirous consumption of the artifact diamond, the desirous product, feed stock gas must not circumvent the hydrogen conversion zone(1). To avoid undesirous consumption of the artifact diamond, the carbon supply must be sufficient to eliminate $O_2$ production. ($H_2O$ dissociation leads to $H_2$ and $O_2$ production unless carbon is present to intercede leading to $H_2$ and CO production.) Work by Tankala et al. (J. Mat. Res. 5, 2483 (1990)) shows that exposure of diamond to oxygen at temperatures as low as 600° C. leads to weight loss. The weight loss is exponential for temperatures exceeding 800° C.

Figure 2:
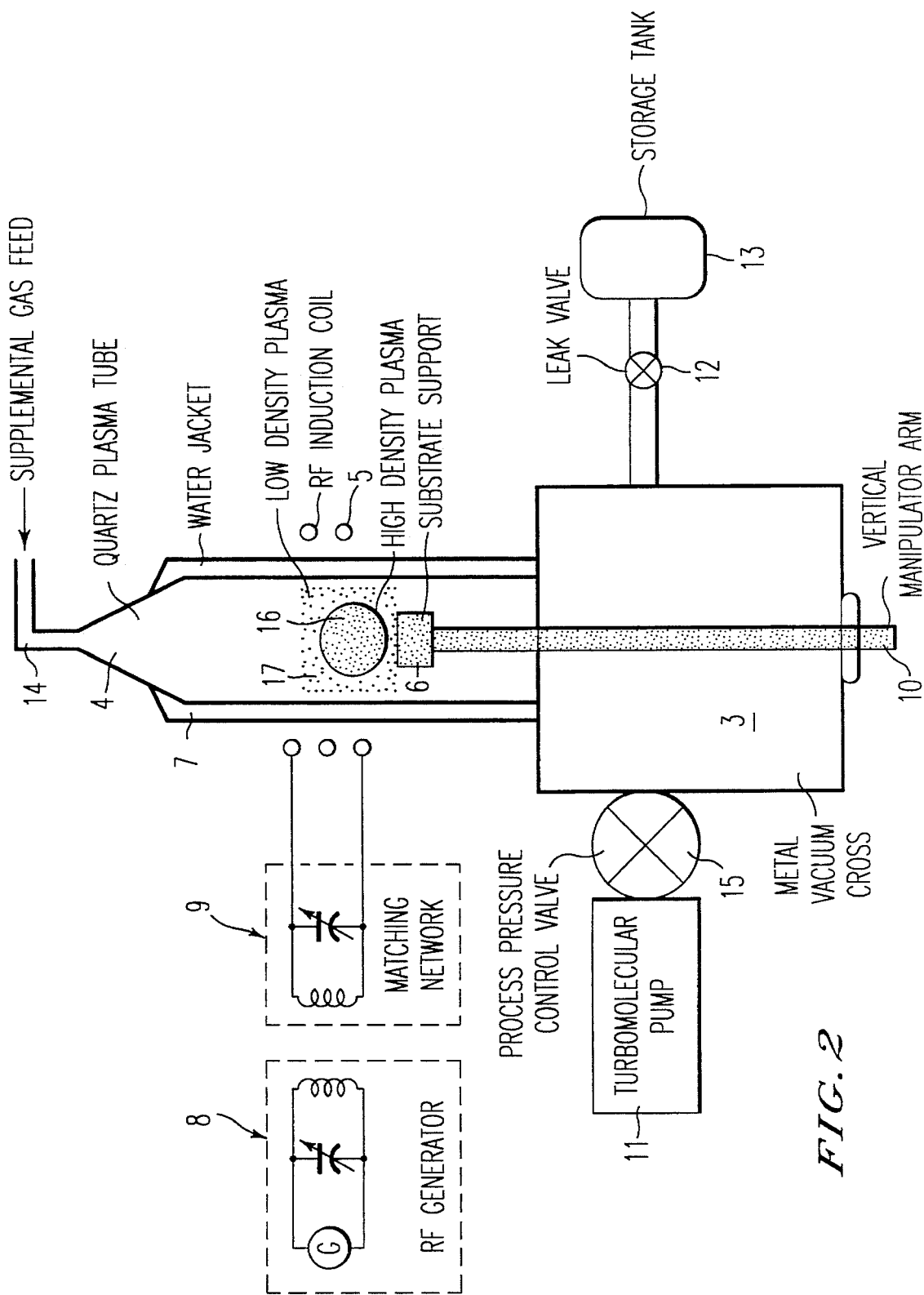
FIG. 2 is a schematic illustration of the isolated rf coil apparatus for producing diamond films according to the present invention.

FIG. 2 shows a preferred embodiment of the apparatus of the invention implemented as a low pressure rf-plasma system including a vacuum cross (3) connected to a plasma tube (4) upon which rf induction coil (5) is wound. The chemical vapor deposition apparatus includes a typical metal vacuum cross chamber (3) upon which vacuum gauging, vacuum pumping, gas introduction, sample introduction, and the plasma-quartz-tube are assembled. Samples are located on a support(6) located just beneath the rf coil region. The support frequently is a graphite fixture but need not be. The quartz plasma tube (4) is a 50 mm i.d. quartz tube with integral water cooling jacket (7). The rf induction coil (5) is powered by a 13.56 MHz rf generator (8). A three-turn coil in parallel with a vacuum capacitor-resonant at 13.56

MHz comprises the rf matching network (9). The matching network (9) is isolated from ground and is principally inductively coupled to the rf generator (8). The high value of shunt capacitance, and the low impedance of the rf coil produce relatively high circulating currents from large differential voltages across the coupling network and rf coil. These high circulating currents create a very strong ac magnetic field which permits effective induction coupling to the low impedance plasma, thereby creating a high or low density plasma gas (as desired) which dissociates the water and alcohol vapor mixture. The apparatus allows samples to be introduced into the vacuum system, and through a vertical manipulator arm (10), to be positioned just beneath the rf induction coil (5). Positioning the sample just beneath the rf induction coil permits the rf power to be applied more discriminantly to the plasma gas. The turbomolecular pump (11) on the apparatus allows the system to be thoroughly evacuated prior the introduction of the process gas. Typically, the vacuum vessel is evacuated to $10^{-7}$ Torr before introduction of the process gas. Once the sample is in position, the process gas mixture is admitted into the chamber through a leak valve (12) at a rate of approximately 20 sccm. The gas mixture which is stored in a tank (13) is leaked into the chamber either at the base of the plasma tube as shown in FIG. 2 or through the supplemental gas feed (14). A process pressure control valve (15) located in front of the turbomolecular pump (11) restricts the pumping to allow the pressure in the chamber to be maintained at 1.0 Torr during diamond deposition. To initiate diamond deposition, a 13.56 MHz rf signal is supplied to the rf induction coil (5). The configuration of the matching network (9) allows a controllable power density confined rf plasma to be maintained inside the coil, within the plasma tube (4).

The confinement is accomplished by a matching network, (9) whereby the rf-coil is electrically isolated from ground, via transformer coupling. The rf induction coil is not directly attached to the metal vacuum cross (3). As a consequence the full ac potential developed across the induction coil does not appear between the induction coil and the metal vacuum cross (3), a ground reference. Furthermore, capacitances from the coil to the plasma and from the coil to ground are balanced with respect to the center of the coil. Thus, the center of the rf-plasma coil appears as a virtual ground, i.e., there exists at no instance in time a voltage between this point and earth ground. A wire connected from this point to ground does not pass current to ground. Conventional configurations which connect one side of the rf coil to ground result in the rf discharge extending from the coil region toward the metal vacuum vessel(3) also at ground reference. In the conventional configuration, application of higher power input results in excitation of a larger volume of gas. Consequently, the gain in power density is sub-linear. However, with the confined apparatus of the current invention shown in FIG. 2, any increase in power maintains approximately the same excitation volume resulting in a linear increase in power density with applied power.

In the present invention, water discharges contain a high density plasma (16) imbedded in a low density plasma (17). The high density plasma (16) is equivalent to a high temperature atomization zone, efficiently dissociating gasses. The low density plasma (17), while inefficient in diamond growth, serves an extremely important function in the current invention. Occupying nearly the entire percentage of the reactor tube cross-section, the low-density plasma converts the water-based solutions to $H_2$, CO, $C_2H_2$, $CH_4$, etc. prior to the water-based solutions entering the high density plasma. FIG. 2 shows the relative position of the low density plasma (17) surrounding the high density plasma (16). The spatial existence of a low density plasma around a high density plasma has been documented by Amorim et al. (J. Vac. Sci. Technol B9, 362 (1991)) investigating Ar rf plasmas for purely diagnostic purposes. Amorim et al. has shown that once induction coupling is achieved there exists an Ar low density plasma in which an Ar high density plasma is imbedded. The Ar high density plasma has an electron density of $\sim 10^{12}/cm^3$ while the Ar low density plasma has an electron density of $\sim 10^{10}/cm^3$.

Hence, the rf plasma system of the present invention provides both the means for conversion of the water-based feedstocks by the extensive low density plasma (17), the conversion zone (1), and the means for atomic hydrogen generation from the high density plasma (16), the hydrogen atomization zone (2). All feed stock gasses transit the conversion or the hydrogen atomization zone with no avenues for circumvention.

Besides isolated inductive coupling, other mechanisms applicable to the present invention are radio frequency circuits possessing a high "Q" factor, (the ratio of stored energy to dissipated energy in the circuit), where the "Q" is necessary to realize the before mentioned transferred power density. High "Q" resonant transmission line segments coupled capacitively, resistively, or inductively to the reactant species provide alternatives to the high "Q" tuned circuit described in the current invention by FIG. 2.

Figure 3:
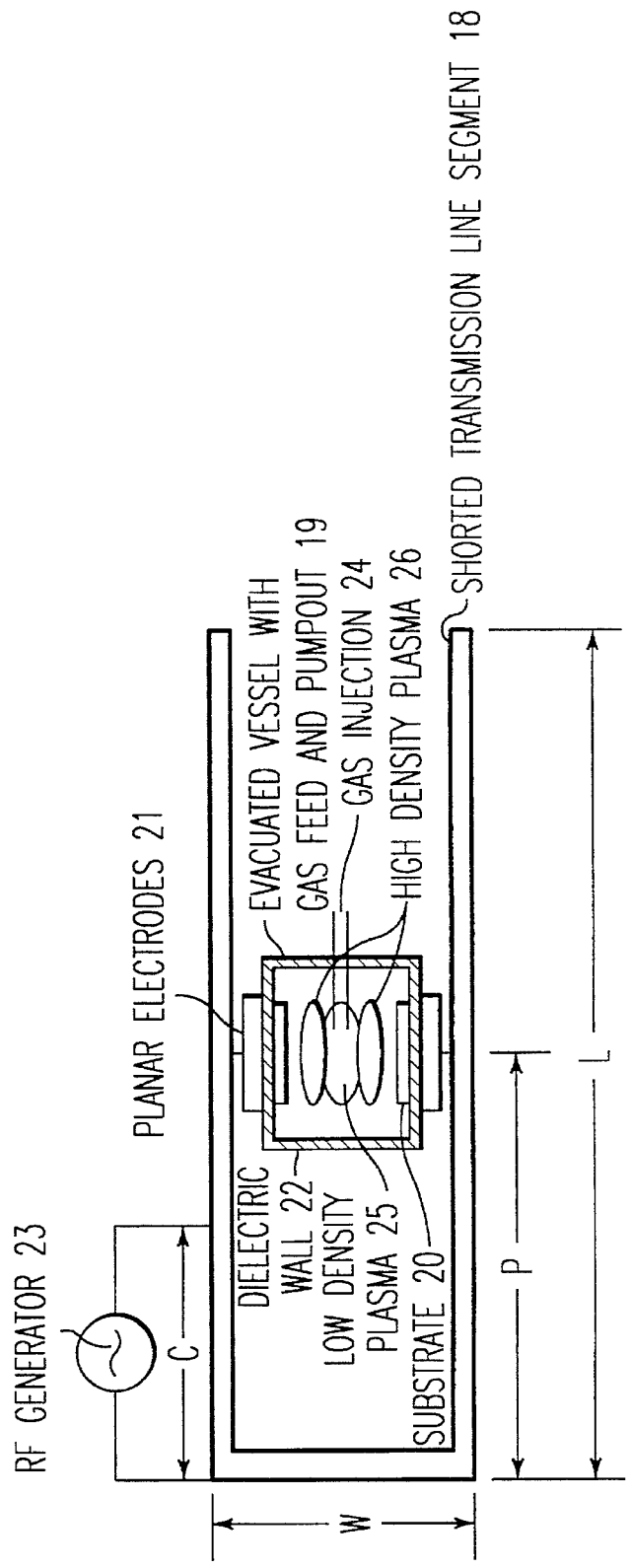
FIG. 3 is a schematic illustration of the resonant transmission line capacitive coupling apparatus for producing diamond films according to the present invention.

In FIG. 3, a resonant transmission line segment is shown with capacitive coupling to the plasma gas. The shorted transmission line segment (18) is electrically connected at some point P which load matches the plasma impedance to the I-V relationship on the shorted transmission line. The plasma is contained in an evacuated vessel (19) to be backfilled with the aforementioned reactant gases. Substrates (20) are in contact with the dielectric wall (22). The planar electrodes (21) are in physical contact with the dielectric wall (22). The dielectric wall (22) prevents electrical breakdown and consequent electrical shorting of the transmission line segment. An rf generator (23) is connected according to FIG. 3 at some point C to secure optimum power transfer to the transmission line segment (18). A gas injection port (24) introduces gas into the evacuated vessel in such a manner that the feed stock transits the low density plasma (25) and high density plasma (26).

Figure 4:
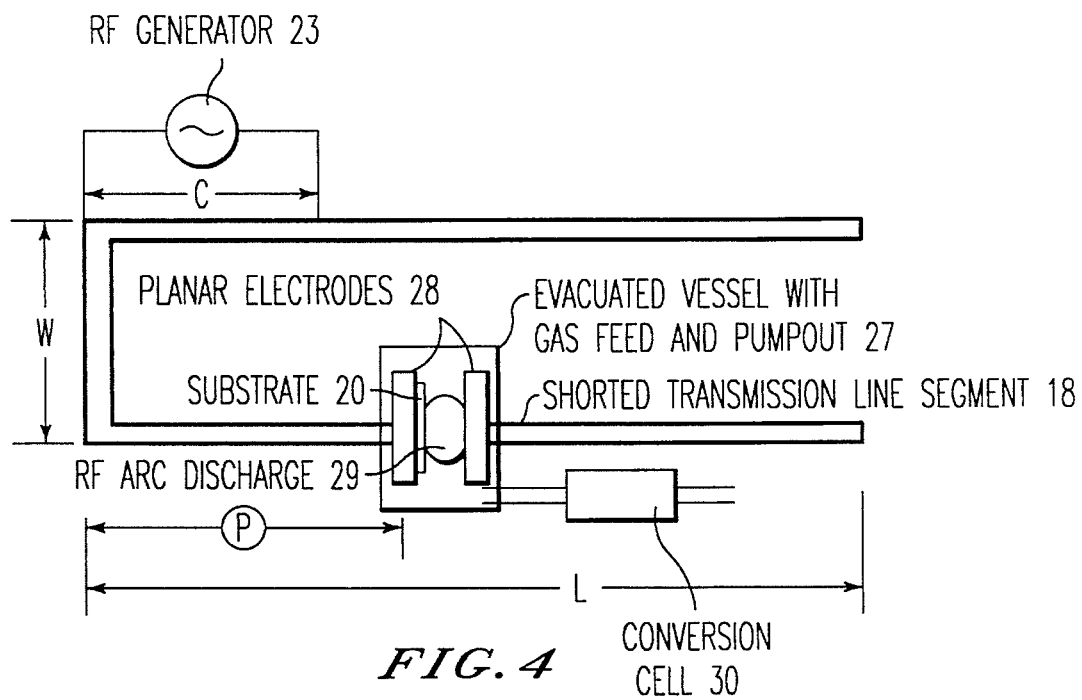
FIG. 4 is a schematic illustration of the resonant transmission resistive coupling apparatus for producing diamond films according to the present invention.

In FIG. 4, a resonant transmission line segment is shown with resistive coupling to the plasma gas. The shorted transmission line segment (18) is electrically connected at some point P which load matches the plasma impedance to the I-V relationship on this line. The plasma is contained in an evacuated vessel (27) to be backfilled with the aforementioned reactant gases. The substrate (20) rests on the planar electrodes (28). The planar electrodes (28) are in physical contact with the plasma gas allowing current flow to occur through the gas. An rf generator (23) is connected according to FIG. 4 at some point C to secure optimum power transfer to the transmission line segment (18). The resistive coupling results in an rf arc discharge (29) in the reactor vessel between the electrodes (28). The arc discharge atomizes the reactants. Thus, according to this embodiment of the present invention, the rf arc discharge serves as a hydrogen atomization zone (1).

According to the present invention, conversion of the feed stock gases in a separate conversion zone (30) occurs prior to the introduction of feed stock gas to the rf arc discharge (29). Shown in FIG. 4 is a conversion cell (30) which functions as the conversion zone (1) shown in FIG. 1. One device suited for gas conversion cell (30) is a thermal oven.

Another device suited for this application is a dc glow discharge. Another device suited for this application is a rf capacitive discharge.

Figure 5:
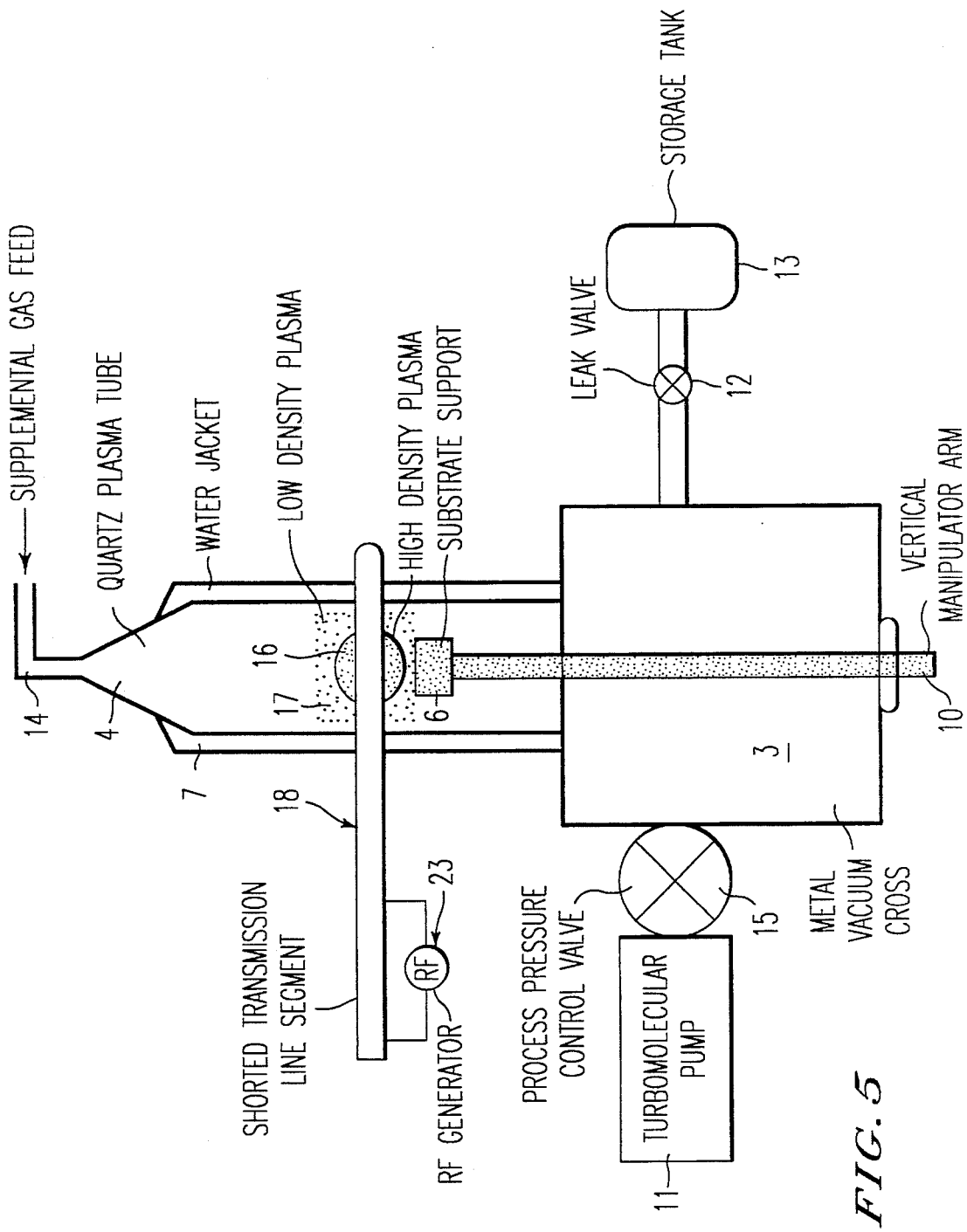
FIG. 5 is a schematic illustration of the resonant transmission inductive coupling apparatus for producing diamond films according to the present invention.

In FIG. 5, a resonant transmission line segment is shown inductively coupled to the plasma gas. The arrangement is nearly identical to the arrangement in FIG. 2, except the rf induction coil (5) and matching network (9) is replaced by a shorted transmission line segment (18). This arrangement uses the high circulating current in the shorted transmission line segment to generate the intense magnetic fields required for induction coupling. The shorted transmission line segment (18) passes around the plasma tube (4) with gas feed and pump out. The walls of the evacuated vessel are such as to permit very strong ac magnetic fields associated with the high circulating currents in the shorted transmission line segment (18) to induction couple power to the low impedance plasma. An rf generator (23) is connected according to FIG. 5 at some point to secure optimum power transfer to the transmission line segment (18).

Figure 6:
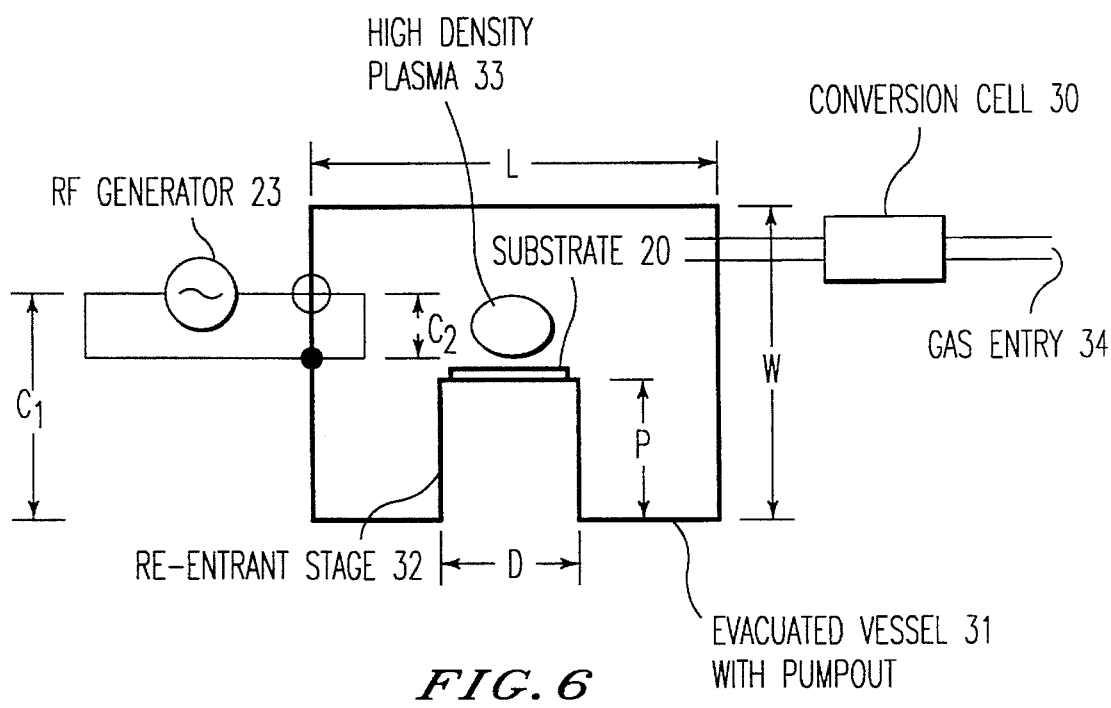
FIG. 6 is a schematic illustration of the rf resonant cavity coupling apparatus for producing diamond films according to the present invention.

Another means of obtaining efficient power transfer to the plasma gas is to employ resonant cavities wherein the frequency for example microwave frequencies, and physical size of the chamber is appropriately matched. For rf frequencies, this requires large volume chambers. As the field of diamond depositions proceeds, large area diamond deposition is required for economy of scale. Such rf resonant cavities of dimensions>4 m differ considerably in size from microwave resonant cavities currently used for small area diamond deposition. Hence for large-area diamond deposition, large dimensions are required for producing uniform deposits over large areas. The principal dimensions of such resonant cavities depends on dimensions W, P, L, $C_1$, $C_2$, and D. W is a value generally small in proportion to L. P is a coupling adjustment, varied to secure best power transfer to plasma gas. $C_1$ and $C_2$ are also coupling adjustments varied to secure best power transfer to plasma gas. L is a length characteristic of operating frequency. Normally L=kn v$\lambda$/4, where k is a constant of proportionality normally equal to 1, and n is an integer 1, 2, 3, etc., and $\lambda$ is the free space wavelength of the frequency chosen, and v is a velocity factor, dependent upon transmission line dimensions and materials of construction. $C_1$, $C_2$, and D are varied to produce best power transfer to plasma gas. FIG. 6 represents an illustrative example of this approach. Other resonant cavity structures are possible. The substrate (20) is located inside an evacuated vessel (31) on a reentrant stage (32). The rf generator (23) is coupled to the resonant cavity at points defined by the dimensions $C_1$ and $C_2$. Application of rf power excites a high density plasma (33) which serves as a hydrogen atomization zone (2). Input feedstock enters the evacuated vessel through the gas entry (34).

In the embodiment of FIG. 6, conversion of the feed stock gases in a separate conversion zone (35) occurs prior to the introduction of feed stock gas to the rf resonant cavity. Shown in FIG. 6 is a conversion zone (1). One device suited for gas conversion is a thermal oven. Another device suited for this application is a dc glow discharge. Another device suited for this application is a rf capacitive discharge The necessity of the conversion for this application depends on the exact mode of cavity excitation. Some modes produce plasma geometry's which make the provision of a conversion zone unnecessary by preventing circumvention.

In reference to FIG. 1, the water/alcohol vapor process, a preferred embodiment of the present invention, is operable in other electric discharges where there is sufficient power density capable of hydrogen atomization provided that suitable means exists to effect transference of the O from the water to CO, Application of water-based processes to these other systems must ensure proper conversion as performed according to the present invention. Induction plasmas have the distinct advantage that an extensive low-density plasma exists which provides the conversion cell integral to the process. Non-induction systems accepting water-based solutions as the gaseous supply must be designed to effect the conversion. The simplest mechanism is to provide a conversion zone external to the diamond apparatus. Modest temperature devices such as dc glow discharges, rf capacitive plasmas, and thermal ovens are suitable for this purpose.

Figure 7:
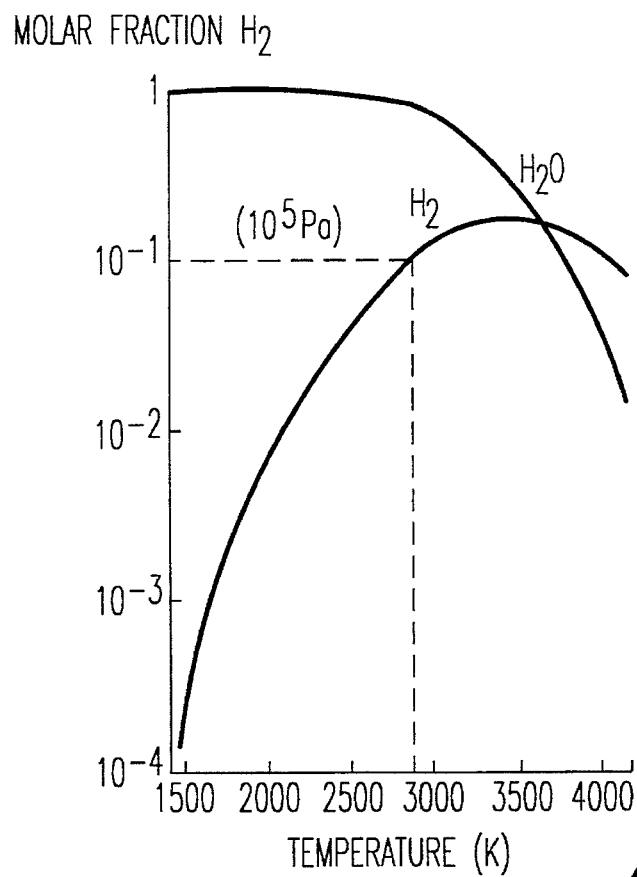
FIG. 7 is a graph showing thermodynamic calculations showing dissociation of $H_2O$ as a function of temperature. Note that to obtain a $H_2$ mole fraction of 0.1 requires temperatures in excess of 2800K.
Figure 8:
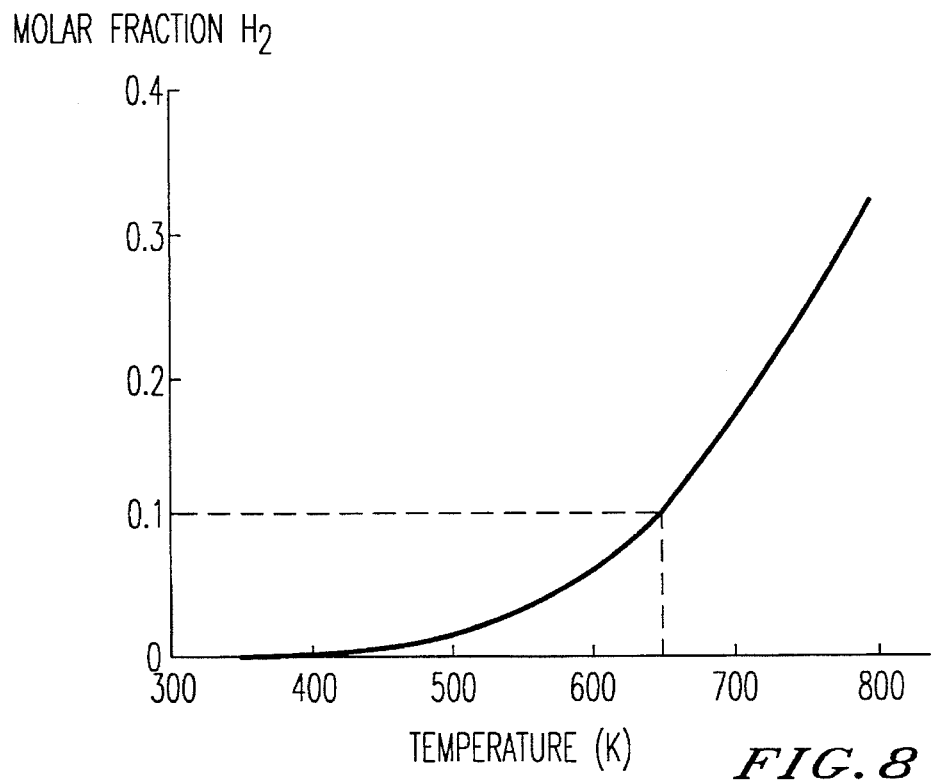
FIG. 8 is a graph showing thermodynamic calculations showing $H_2O$—$C_2H_6O$ reformation as a function of temperature. Note that to obtain a $H_2$ mole fraction of 0.1 requires temperatures ~650K, from a water solution containing $C_2H_6O$. This temperature is approximately ⅙ the temperature required from pure $H_2O$.

Thermodynamic data shows that the chemical potential gained by CO formation allows conversion to occur at modest temperatures (1000K). Thus, the conversion cell does not have to be as "hot" as the hydrogen atomization zone. To see the pronounced effect that carbon in the gas phase has on chemical conversion, examine the thermodynamic calculations of Lede et. al. (Int. J. Hydrogen Energy 7, 939 (1982)) (FIG. 7) and compare those results to those of Garcia and Laborde (Int. J. Hydrogen Energy 16, 307 (1991)) (FIG. 8). These are equilibrium calculations. They show what the product distributions are in a stagnant environment where no reactant enters and no products leave a vessel. While these results can be significantly different from experience in a diamond growth reactor where significant reactant enters and leaves, they represent guidelines for chemical trends. Lede et al. for the purposes of evaluating the efficiencies of molecular hydrogen production from water in a solar-concentrator oven calculates the molar fraction of $H_2$ available in $H_2O$-vapor as a function of temperature. Note that temperatures in excess of 2800K are necessary to produce a molar fraction of 0.1 $H_2$. Garcia and Laborde for the purposes of improving alternative fuel synthesis from the steam reformation of alcohols calculate molecular $H_2$ generation from mixtures of $H_2O$ and ethanol ($C_2H_2O$). With ethanol addition, mole fractions of 0.1 $H_2$ are achieved at fairly modest temperatures (650K). CO formation prevents the back reaction ($2H_2+O_2=2H_2O$) from occurring. CO formation also reduces the energy of the chemical system through the formation of an extremely robust C=band.

In a preferred embodiment of the present invention, water is mixed with alcohol, wherein the alcohol supplies the carbon necessary for diamond deposition. Alcohols provide a convenient carbon source which are miscible in water and, thus, eliminating gas manifolding. Alcohols such as methanol, ethanol, and isopropanol which are miscible in water provide carbon species necessary for growth in the current process. Pure water discharges which etch graphite do not deposit diamond on substrates adjacent to the graphite. Without additional carbon from the hydrocarbon source (i.e. the alcohol), oxygen as O or OH etches the diamond seeds disallowing diamond growth. Seemingly, one could compensate the oxygen etching by adding a higher percentage of alcohol to the gas phase. However, adding a higher percentage of the hydrocarbon source reduces the supply of atomic hydrogen. Free carbon in the gas phase scavenges atomic H forming stable hydrocarbons such as $C_2H_2$. The hydrogenation of this free carbon steals atomic hydrogen from the gas phase. Without sufficient atomic hydrogen, diamond growth is degraded by the coexistence of non-diamond phases. (See Yarbrough reference given earlier.) Thus, it is important to supply enough carbon to the conversion process to complete oxygen transference without polluting the gas stream with surplus carbon which scavenges atomic H.

Alcohols are merely fully saturated hydrocarbon chains terminated with OH. Table I lists ranges of parameters wherein water/alcohol solutions deposit diamond. Table I lists also the preferred range wherein diamond growth has been demonstrated by the present inventors. Correspondingly, proper water dilution of hydrocarbons rather than alcohols produces equivalent C/O ratio as the common alcohols. Thus, hydrocarbons metered separate from the water into the reaction chamber are applicable to the present invention. The hydrocarbons have a wide variety of $$\frac{H}{C+H}$$

ratios and do not contain oxygen. Listed below are some common hydrocarbons with the $$\frac{H}{C+H}$$

ratio.

$CH_4$ 0.80

$C_2H_2$ 0.50

$C_2H_4$ 0.66

$C_2H_6$ 0.75

$C_3H_6$ 0.66

$C_3H_8$ 0.72

From the alcohol-water results, a C/O ratio of 0.55 yields high quality diamond growth. For $CH_4$—$H_2O$, this requires 65% $H_2O$ in the input feedstock gas phase resulting in an hydrogen concentration of 73%. For $C_2H_2$-water a C/O ratio of 0.55 requires 78% water, in the input feedstock gas phase with a corresponding 62% hydrogen concentration. Table III gives a list of hydrocarbons that are applicable to the current invention. Table III shows the H atom concentration of each of these hydrocarbons at the preferred C/O ratio of 0.55. The preferred range for the C/O ratio is between 0.40 and 0.80.

TABLE I

| Parameter | Range | Demonstrated Range |
|---|---|---|
| Substrate Temperature | 55–1100° C. | 250–1000° C. |
| Pressure | 0.005–760 Torr | 0.30–5.0 Torr |
| Water Concentration | >20% gas volume | 40–80% gas volume |
| Alcohol Concentration | See TABLE II | See TABLE II |
| Hydrocarbon Concentrate | See TABLE III | See TABLE III |

TABLE II

| Fully Saturated Alcohols | | Demonstrated c/o Ratio | Preferred c/o Ratio |
|---|---|---|---|
| Methanol | $CH_4O$ | 0.53 | 0.55±0.20 |
| Ethanol | $C_2H_6O$ | 0.68 | 0.55±0.20 |
| Propanol | $C_3H_8O$ | 0.51 | 0.55±0.20 |
| Butanol | $C_4H_{10}O$ | | 0.55±0.20 |
| Pentanol | $C_5H_{12}O$ | | 0.55±0.20 |
| Hexanol | $C_6H14O$ | | 0.55±0.20 |
| Octanol | $C_7H_{16}O$ | | 0.55±0.20 |

TABLE III

| Hydrocarbons | | Preferred C/O Ratio | H Atom Content |
|---|---|---|---|
| Methane | $CH_4$ | 0.55 | 73% |
| Acetylene | $C_2H_2$ | 0.55 | 62% |
| Ethylene | $C_2H_4$ | 0.55 | 66% |
| Ethane | $C_2H_6$ | 0.55 | 70% |
| Propane | $C_3H_8$ | 0.55 | 71% |

Another preferred embodiment of the invention is the addition of acids such as acetic acid to the water mixture to provide a convenient source of atomic hydrogen. Acetic acid ($CH_3COOH$) contains the COOH moiety whose COO—H bond strength is ~1/10× the bond strength of HO—H. Thus, radicals of COOH in the plasma discharge readily supply atomic hydrogen to the growth surface. Furthermore, halogenation of the acetic acid ($CH_2$ Cl COOH or CH $Cl_2$ COOH) weakens the COO—H bond even in the parent acetic acid group. Thus, the addition of chloroacetic or dichloroacetic acids to the growth process further enhances the supply of atomic hydrogen through weakening of the COO—H bond.

To better appreciate these principles, we give the following examples: The bond dissociation energies for the molecular hydrogen dimer, H—H (104 kcal/mol), and water, HO—H (119 kcal/mol), are comparable and both OH and H can play the same roles in the diamond process. However, OH derived form a water discharge (plasma) is itself a long lived species and provides a long lifetime environment for other species. Thus, we have experimentally observed that the critical population of atomic hydrogen and OH required for high quality diamond growth from the water process can be achieved at significantly lower plasma powers and reactor pressures, as compared to molecular hydrogen based processes (see Comparative Example 3). The bond energy between the H atom and the COO—H unit is 12 kcal/mol. Recall that the bond energy appears in an exponential for dissociation. A factor of 9 change in an exponential represents an enormous rate enhancement in dissociation (approx. 8000×).

Further process enhancement can be obtained through the use of chloroacetic acid or even dichloroacetic acid. For those cases, the substitution of the more electronegative species (Cl) for hydrogen in the methyl group of the acetic acid molecule weakens the bond of the hydrogen in the OH group still more.

In another preferred embodiment, addition of hydrogen peroxide or hydrazine to the water solution also provides convenient sources for H and OH to the growth process. These compounds like acids are typically supplied from the manufacturer in a water-base. The water base stabilizes the compounds against spontaneous reactions at room temperature and pressures. The water-base that is supplied by the manufacturer is clearly compatible with the water-based diamond growth according to the present invention. While the water base stabilizes these reactants ($N_2H_2$ and $H_2O_2$) at room temperature and pressure, introduction of these species into a plasma region provides efficient generation of H and OH groups.

As above noted, the addition of acids such as acetic acid to the water mixture also provides a convenient source of atomic hydrogen. Organic acids, added to the water/alcohol solutions, enhance diamond growth. Acetic acid $CH_3$ COOH has been added to the water/methanol solutions. Given the close chemical constituency of methanol and acetic acid, acetic acid solutions in water were evaluated for diamond growth. No deposition was observed. Solutions from 20–80% acetic acid in water were tested. The addition of the acetic acid to the water did, however, lower the power level necessary to obtain induction coupling. Acetic acid has a low ionization potential. Its addition to the gas phase reduces the required magnetic field intensity to support ionization by the magnetic forces, the electromotive force.

The water-based processes have been used with the acetic acid to reduce the power requirement for diamond growth (see Example 5). Accordingly the present invention permits performing extremely low temperature growths depending on the physical limitations related to impurity atom (in particular O and H) elimination from the diamond crystal. Since diamond growth has been reported at temperatures as low as 135° C. by Prof. Komiyama at Tokyo University (see Diamond Depositions: Science and Technology, 15, (Aug. 1991)), it is clear that impurity atom elimination in this low temperature range is possible. There are two mechanisms for low temperature O and H elimination from the diamond crystal as it is growing. One mechanism is purely thermal desorption of O and H terminating species from the growth surface. The other mechanism is chemical extraction of O and H terminating species from the growth surface. The former mechanisms occur at temperatures above 600° C. and hence are not active at low temperatures. The chemical extraction mechanisms, while not documented for diamond, have been studied for extraction of H from Si(100) surfaces. These mechanisms have activation energies less than 20 kcal/mol and hence are active even at low temperature.

At low temperatures, the water-based process have to eliminate water from the growth surfaces. Water physisorbs at low temperatures to inhibit diamond film growth by obscuring the diamond surface from carbon radical addition. The thermal desorption of physisorbed water from metals such as stainless steel and aluminum has been studied. Water desorbs from these surfaces at temperatures above 55° C. (see S. J. Pang et al. in J. Vac. Sci. Technol. A5, 2516). A maximum is observed at 85° C. Hence, the growth of diamond at temperatures greater than 55° C. is not inhibited by water physisorption on the growth surface. Accordingly, diamond deposition according to the present invention is practiced within a temperature range of 55° C. to 1100° C., preferably within 250° to 1000° C., and at a pressure between 0.005 to 760 Torr, preferably within 0.3 to 5 Torr.

EXAMPLES

The following examples are provided to illustrate the present invention but are not to be construed as limiting the invention in any way.

EXAMPLE 1

The confined rf plasma system depicted in FIG. 2 was used for this work. Si wafers abraded with diamond powder and graphite fibers were introduced to the system. Samples were inserted into the plasma tube (4) just beneath the rf induction coil (5). Samples were located on a graphite susceptor (6) which heats from currents induced in the graphite by the high ac magnetic field in the rf induction coil (5). A process pressure control valve (15) located in front of the turbomolecular pump (11) restricted the pumping to allow the pressure in the chamber to be maintained at 1.0 Torr during diamond deposition. To initiate diamond deposition, a 13.56 MHz rf signal was supplied to the rf induction coil (5).

Preparation of the gases used in practicing the present invention was performed by mixing the water/alcohol solutions in a holding container. An evacuated vessel, the storage tank (13), was submerged in the holding container, then opened to draw the water alcohol mixture into the tank, and then closed to allow transport of this mixture to the growth reactor. A volumetric mixture with 20% methanol and 80% water was siphoned into a storage tank(13). The 80% water solution used for demonstration of the invention resulted in an input water vapor concentrations in the gas phase of 47%, the C/O ratio was 0.53. Once installed on the growth reactor, the connecting lines were evacuated by opening a leak valve (12) to the vacuum vessel (3). At that point the leak valve (12) was closed, the storage tank was opened, and the gas mixture equilibrated to the leak valve (12). The leak valve (12) was opened to admit the water/alcohol mixtures into the vacuum chamber. The leak rate was adjusted to ~20 sccm. Pressure in the plasma system was controlled at 1.00 Torr. Typically, the procedure after installation of the storage tank (13) was to pump through the leak valve (12) for 30 minutes before setting the pressure in the chamber for diamond growth. This procedure eliminated air trapped during the filling of the storage tank (13).

Between 1000 and 1500 W rf power was applied to the rf coil. This power level was sufficient to maintain a brilliantly luminescent induction plasma. Optical emission from the water vapor alcohol plasmas shows a 656 nm atomic hydrogen emission as well as OH emissions. No evidence for atomic oxygen emission was seen. This provides direct evidence that conversion to CO and not $O_2$ was occurring. Pure water discharges with no available carbon source produce $H_2$ and $O_2$ by-products. The sample temperature was around 600° C. during this run. The deposition process proceeded for 2 hours at which time the sample, upon cooling, was removed from the system for inspection.

Figure 9:
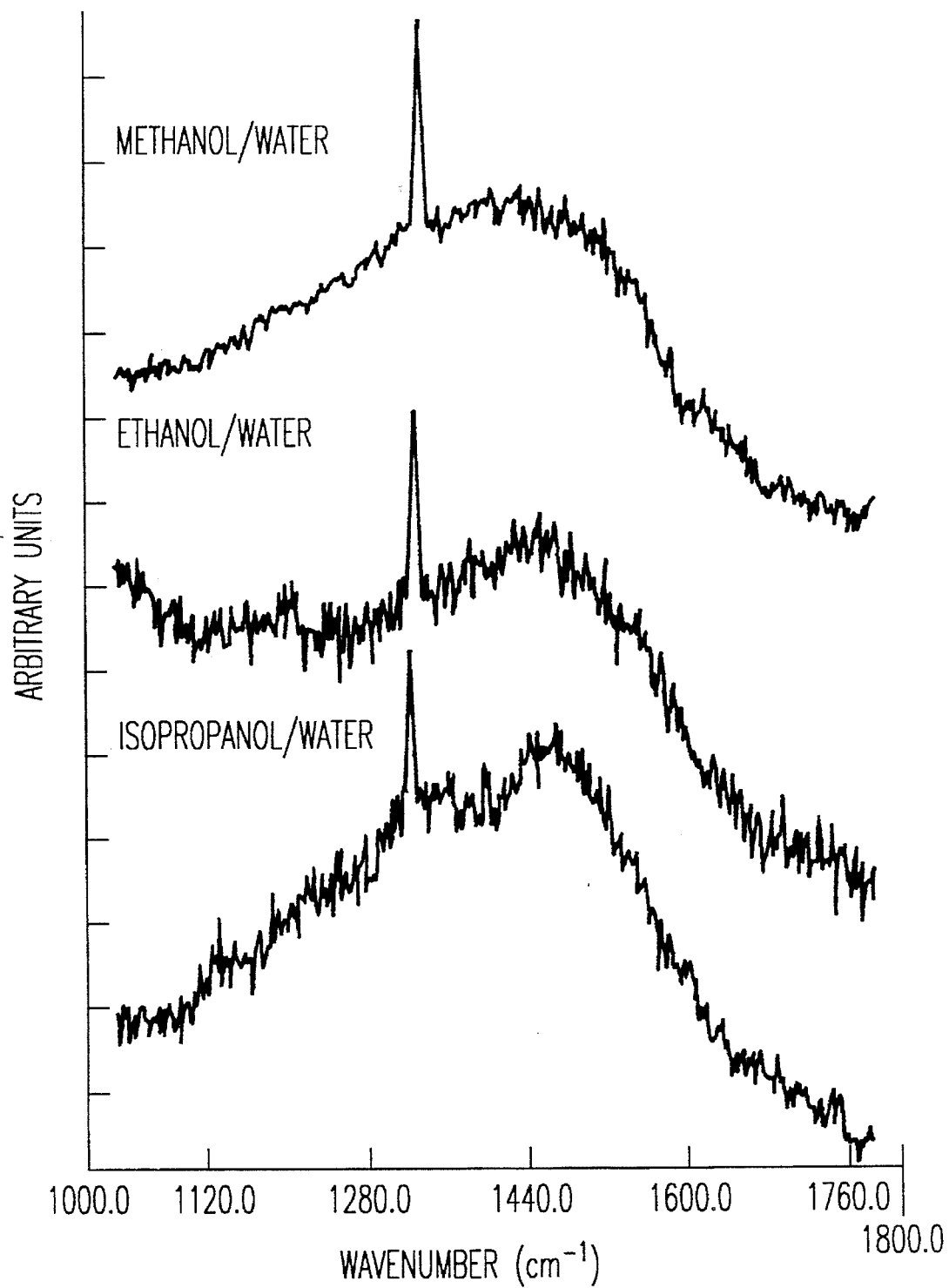
FIG. 9 is a graph showing the Raman spectra from three films grown with water/methanol, water/ethanol, and water/isopropanol.
Figure 10A:
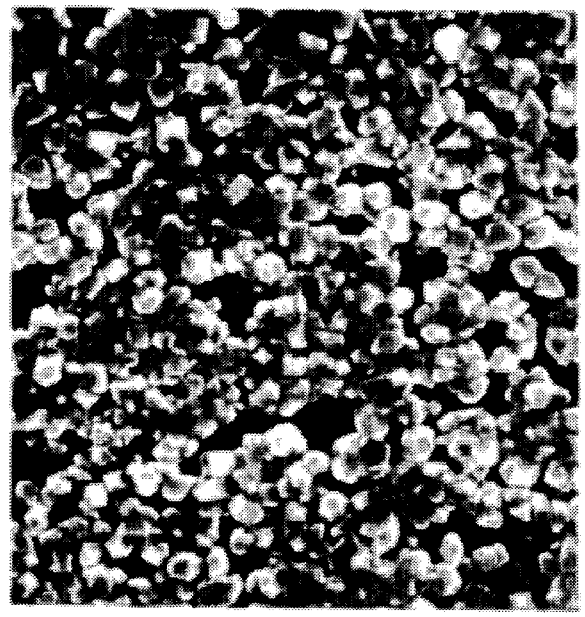
FIGS. 10a, 10b and 10c show SEM photographs of the polycrystalline diamond films produced by the three different water/alcohol compositions noted with respect to FIG. 9.

FIG. 9 shows a Raman spectrum labeled methanol/water from this sample. Diamond as evidenced by the 1332 $cm^{-1}$ line was clearly deposited. FIG. 10 is a composite figure from three films grown with water/methanol, water/ethanol, and water/isopropanol. It shows a SEM photograph (FIG. 10a) of the crystals deposited from the water/methanol mixture used in this example.

EXAMPLE 2

Using the same procedures as followed in example 1, diamond was deposited from the vapor effluent from a liquid mixture containing 20% ethanol and 80% water. The 80% water solution used for demonstration of the invention resulted in an input water vapor concentration in the gas phase of 66%, the C/O ratio was 0.68. The leak rate was set to ~20 sccm. The pressure was maintained at 1.0 Torr. The rf power applied to the coil was between 1000 and 1500 W. The sample temperature was around 600° C. during this run. After 2 hours, the sample was removed from the system for inspection.

Figure 10B:
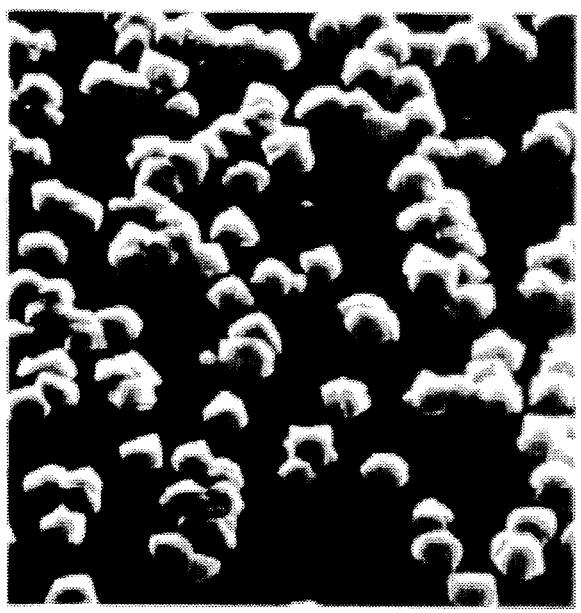

FIG. 9 shows a Raman spectrum labeled water/ethanol from this sample. Diamond as evidenced by the 1332 $cm^{-1}$ line was clearly deposited. FIG. 10 is a composite figure from three films grown with water/methanol, water/ethanol, and water/isopropanol. It shows a SEM photograph (see FIG. 10b) of the crystals deposited from the water/ethanol mixture used for this growth.

EXAMPLE 3

Using the same procedures as followed in example 1, diamond was deposited from the vapor effluent from a liquid mixture containing 20% isopropanol and 80% water. The 80% water solution used for demonstration of the invention resulted in an input water vapor concentration in the gas phase of 83%, the C/O ratio was 0.51. The leak rate was set to ~20 sccm. The pressure was maintained at 1.0 Torr. The rf power applied to the coil was between 1000 and 1500 W. The sample temperature was around 600° C. during this run. After 2 hours, the sample was removed from the system for inspection.

Figure 10C:
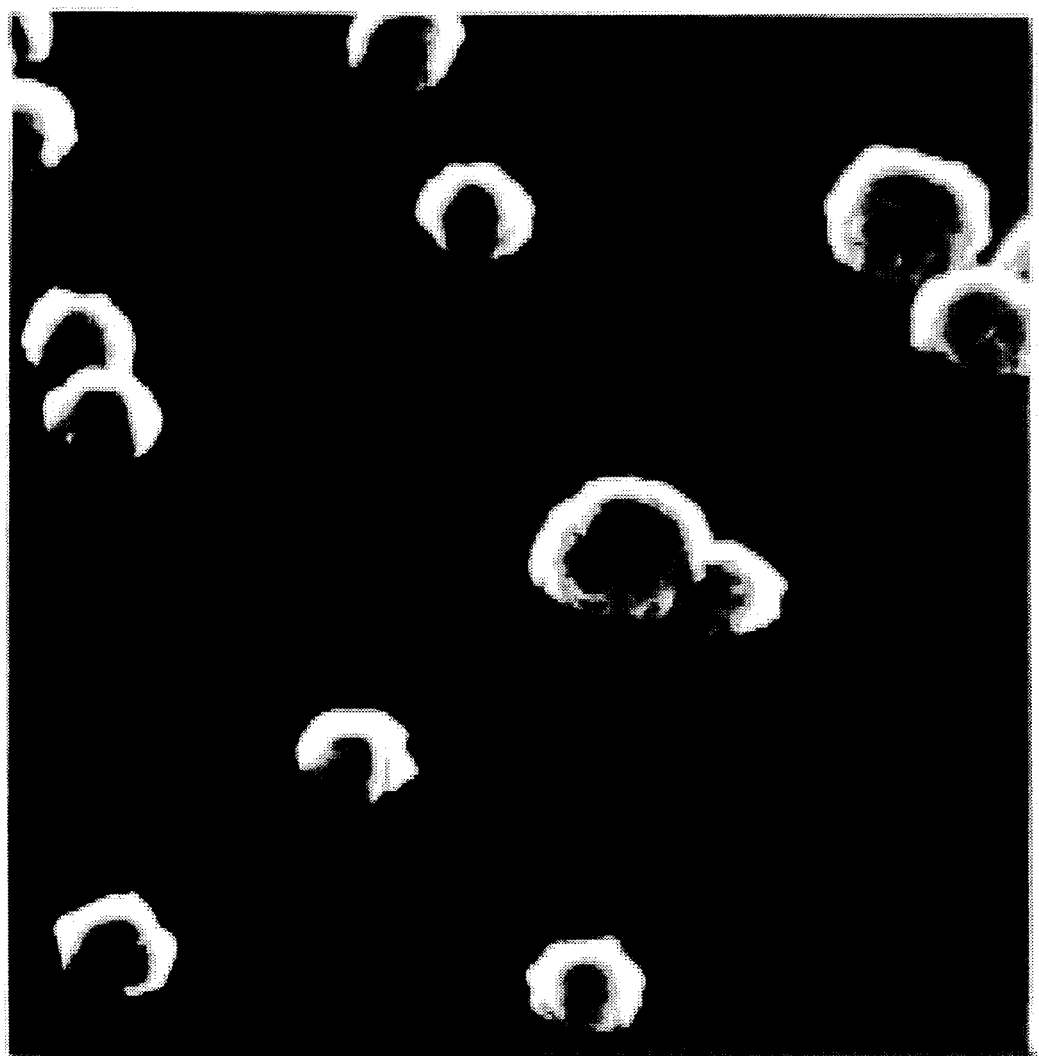

FIG. 9 shows a Raman spectrum labeled water/isopropanol from this sample. Diamond as evidenced by the 1332 $cm^{-1}$ line was clearly deposited. FIG. 10 is a composite figure from three films grown with water/methanol, water/ethanol, and water/isopropanol. It shows a SEM photograph (see FIG. 10c) of the crystals deposited from the water/isopropanol mixture used for this growth.

EXAMPLE 4

Figure 11:
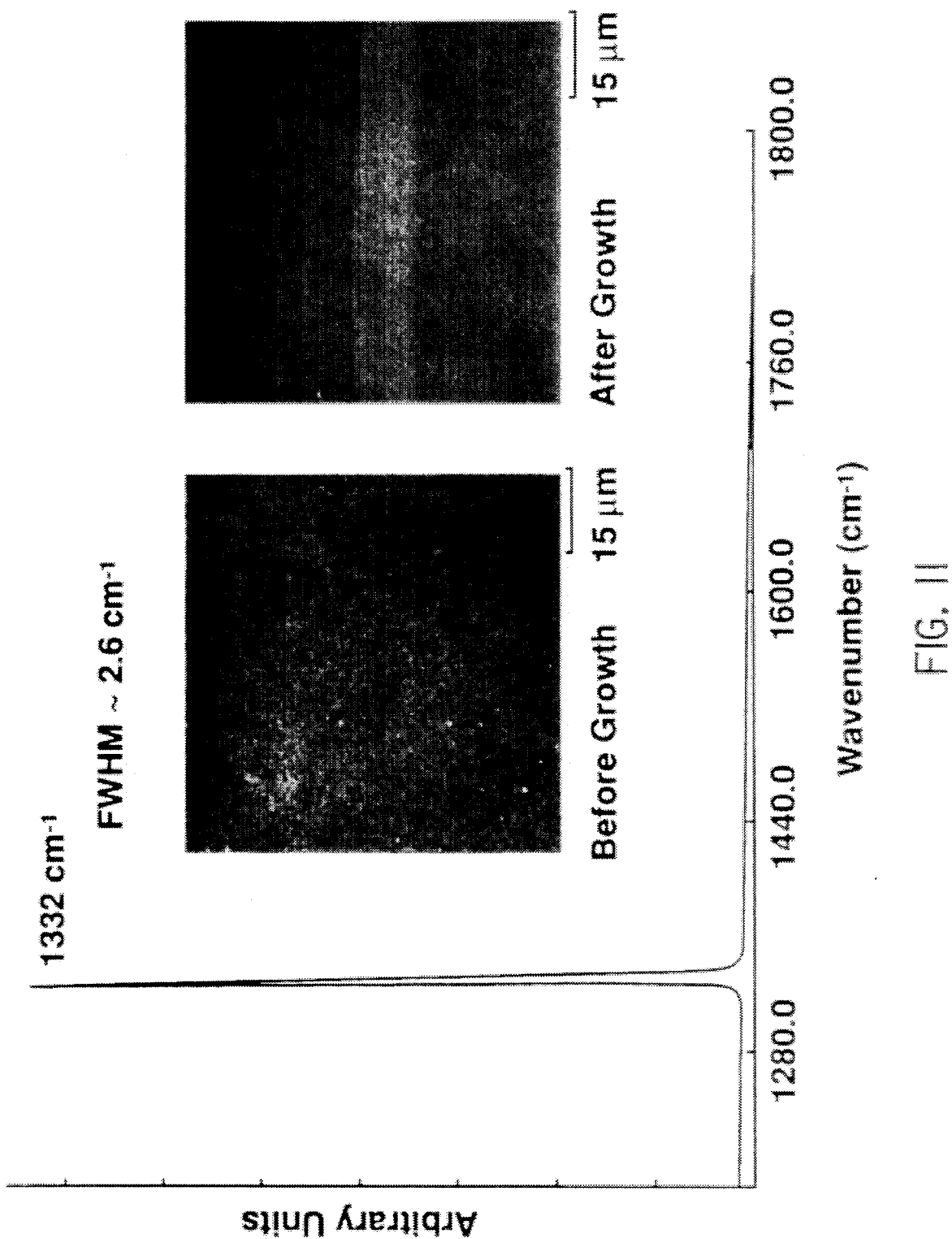
FIG. 11 shows Raman data for diamond growth on a natural diamond crystal; it also shows a SEM photographs of the diamond single crystal before and after the homoepitaxial deposition.
Figure 12A:
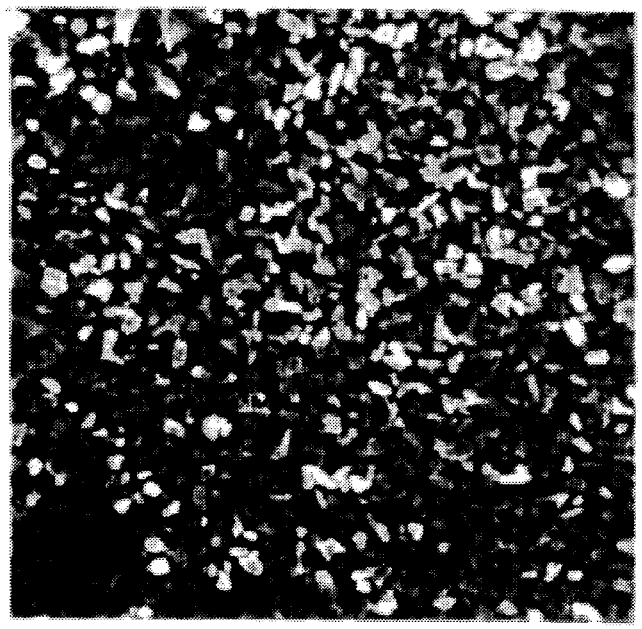
FIGS. 12a, 12b, 12c, 12d, and 13 illustrate SEM micrographs and Raman spectrum, respectively, of diamond films deposited according to a further embodiment of the present invention regarding acetic acid addition to the diamond growth.
Figure 12B:
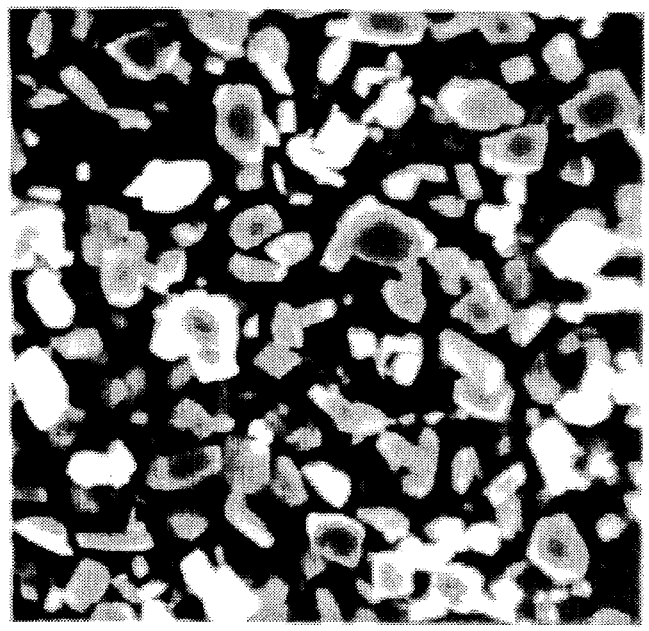
Figure 12C:
Figure 12D:
Figure 15:
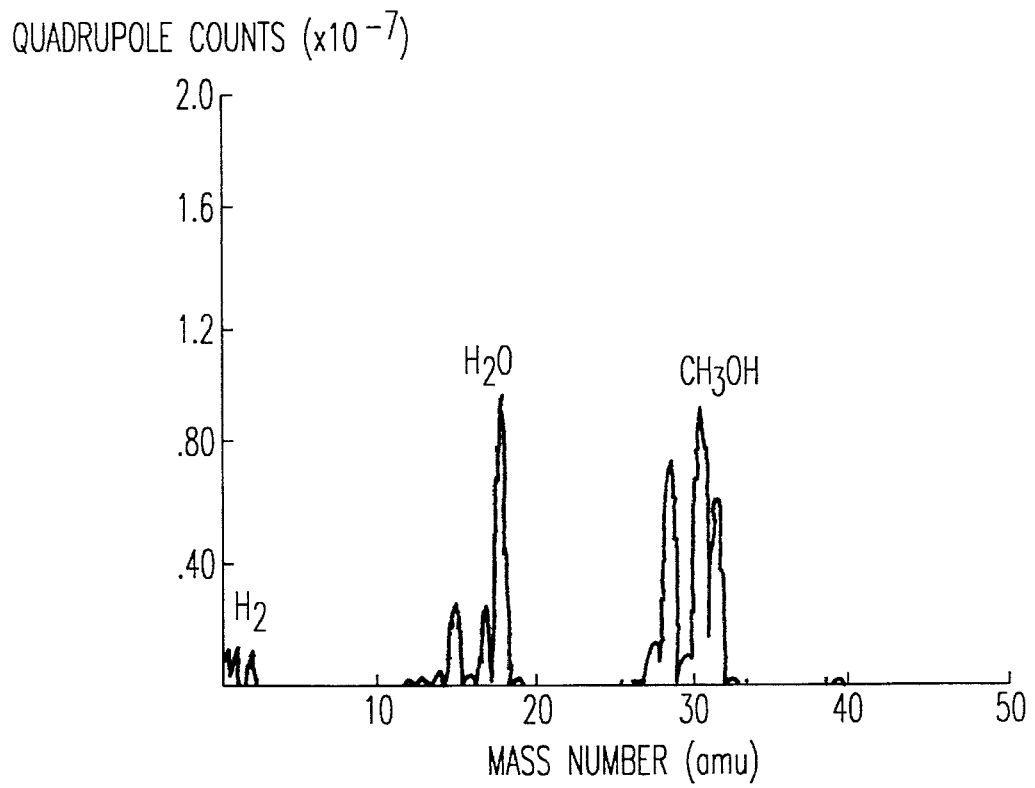
FIG. 15 is a Quadrupole mass spectrum showing the gas phase abundance of water and methanol as supplied from a 33% methanol in water solution.

Besides production of polycrystalline diamond films, homoepitaxial layers have been deposited using water/methanol and water/ethanol. For homoepitaxial growth with ethanol, the same procedures were followed as per Examples 1–2. The ethanol sample had the cleanest topography. Raman analysis of the deposited layer showed a very narrow FWHM comparable to the starting substrate. No amorphous carbon or graphite was detected. Growths on natural diamond crystals produced relatively smooth homoepitaxial diamond films. FIG. 15 shows Raman data from growth on a natural diamond crystal. Micro-focus Raman was used to examine the near surface of the deposited film. It had a FWHM of 2.6 $cm^{-1}$ as compared to the substrate of 2.75 $cm^{-1}$. Thus, the growth from water/ethanol was a higher quality than the original substrate. FIG. 11 also shows a SEM photograph of the diamond epitaxial surface. The surface shows a slightly mottled texture, i.e., an apparent variation in contrast as observed by the SEM due to low angle grain boundaries in the material, but shows no features associated with a polycrystalline growth.

EXAMPLE 5

Figure 13:
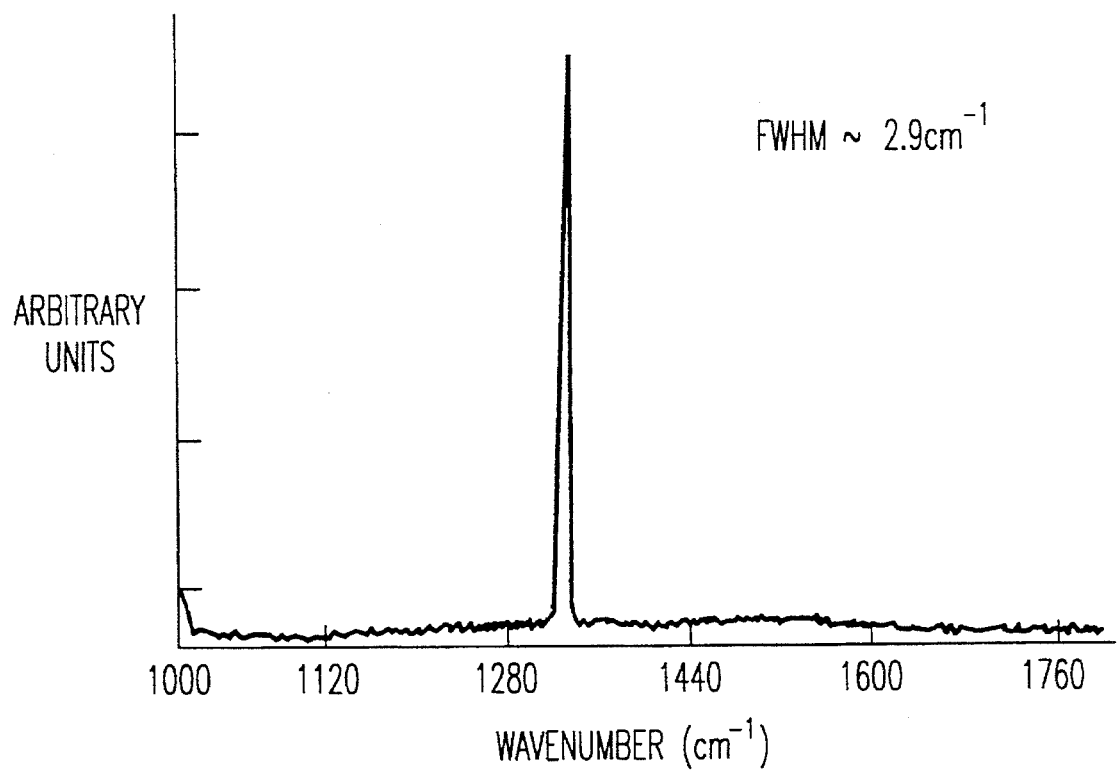

Using the same procedures as followed in example 1, diamond was deposited from the vapor effluent from a liquid mixture containing 20% methanol, 40% acetic acid, and 40% water. The leak rate was set to ~20 sccm. The pressure was maintained at 0.5 Torr. The rf power applied to the coil was between 300 and 400 W. The sample temperature was around 300° C. during this run. After 16 hours, the sample was removed from the system for inspection. FIG. 12 shows a SEM micrograph of diamond crystals deposited at 350° C. using acetic acid, water and methanol. The crystals show a very different morphology with habits that are not isotropic. FIG. 13 shows the Raman spectrum from the sample shown in FIG. 12. It shows no appreciable amorphous component and an extremely sharp 1332 $cm^{-1}$ Raman line.

Mixtures of acetic acid, water, and methanol allow diamond growth at very lower power levels. Indeed diamond growths have been accomplished at approximate power levels of 300 W for the acetic-acid:water:methanol (2:2:1) as compared to 1000 W for the water:methanol (Example 1). The reduced rf power input permits diamond growth to occur at very lower temperatures.

COMPARATIVE EXAMPLE 1

To demonstrate the importance of the water vapor to diamond deposition, a sample was deposited in the present invention apparatus using pure methanol. The growth conditions and procedures were the same as Example 1 except water was omitted. Only a few nucleation sites were observed. The crystals were not well faceted and appeared to have a substantial amount of non-diamond bonding.

COMPARATIVE EXAMPLE 2

To demonstrate the importance of the alcohol to the growth process, growths at less than 20% methanol by volume liquid in the storage tank have not produced any growth. Growth conditions and procedures were the same as in Example 1.

COMPARATIVE EXAMPLE 3

Diamond growth in the current invention has been demonstrated in a rf plasma discharge system wherein the water-based plasma processes which are disclosed here have been compared to $H_2$-based discharges for the growth of diamond. Comparison of the power levels and pressures necessary for diamond growth in this rf plasma discharge system between both processes is used to derive the efficacy of each process for diamond growth.

Comparing the conditions of diamond growth in this reactor for the water/alcohol to the conditions of diamond growth in this reactor for the more conventional $CH_4/H_2$, one sees from Table IV that the conditions for the water-alcohol diamond growth for process of the present invention are at reduced pressure, lower temperature, and reduced power.

TABLE IV

| Parameter | Water/Alcohol | $H_2/CH_4$ |
| --- | --- | --- |
| pressure | 1.0 Torr | 5.0 Torr |
| temperature | 625° C. | 850° C. |
| power | 600W rf power | 2400 W rf power |
| flow rate | 20 sccm | 15 sccm |
| composition | 40% alcohol in vapor | 1% $CH_4$ in vapor |

Despite the conditions of reduced power and pressure, the propensity of the water discharge to produce etchant species for graphite has been confirmed. Graphite dissolution has been measured for the water-based verses the molecular $H_2$-based processes. The water/alcohol mixtures according to the present invention deposited diamond at 0.5 mm/hr and etched graphite at 25–50 mm/hr. The samples (located on the graphite susceptor during growth) masked the graphite allowing measurements of the graphite dissolution rate while the samples gave a measure of the diamond deposition rate. $H_2/CH_4$ discharges also etched the graphite, but only at about 0.5 mm/hr. The factor of nearly 100 reflected significant differences in the water process over the $H_2$ process. This gasification process as previously noted provided a pathway for oxygen transference to CO.

COMPARATIVE EXAMPLE 4

Figure 14:
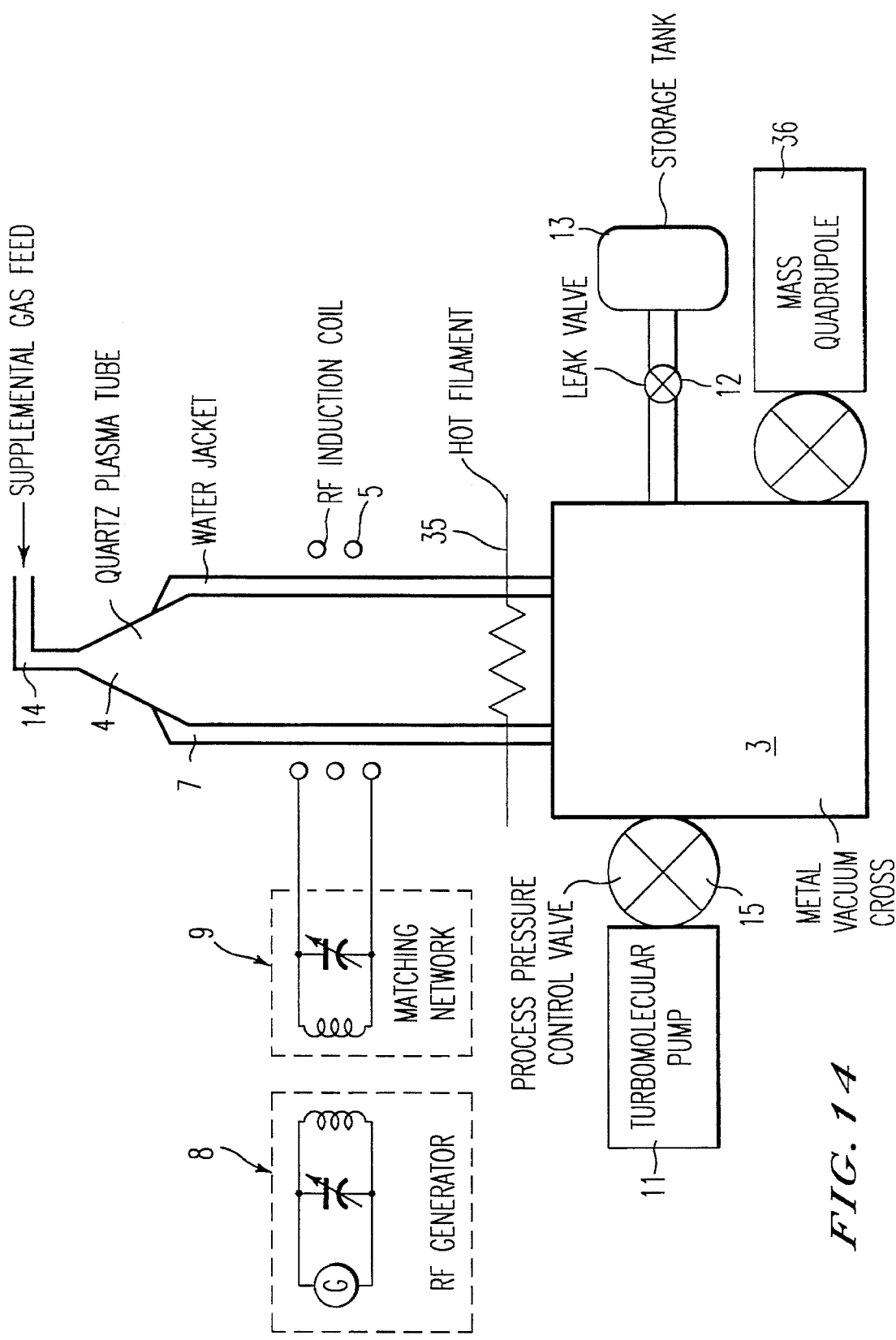
FIG. 14 is a schematic illustration of an apparatus adopted to measure the conversion efficiencies of 1) the low pressure rf plasma system of the current invention and 2) a simple hot filament.

In an apparatus similar to the invention apparatus shown in FIG. 2, a quadrupole mass spectrometer was used to compare the gas conversion propensity of the current invention to the gas conversion propensity of a simple hot-filament (35) (see FIG. 14). In these experiments, the water/methanol vapors were admitted at a rate of 20 sccm and 0.5 Torr. These vapors constituting nearly equal parts water and ethanol were admitted through the supplemental gas feed and transited the induction plasma or the hot-filament before being sampled by the mass quadrupole (36). When comparing the conversion efficiency between the hot-filament or the rf plasma apparatus of the current invention, only one source was active at a time. The plasma was off when the hot-filament was on. The filament was off when the plasma was on.

Figure 16:
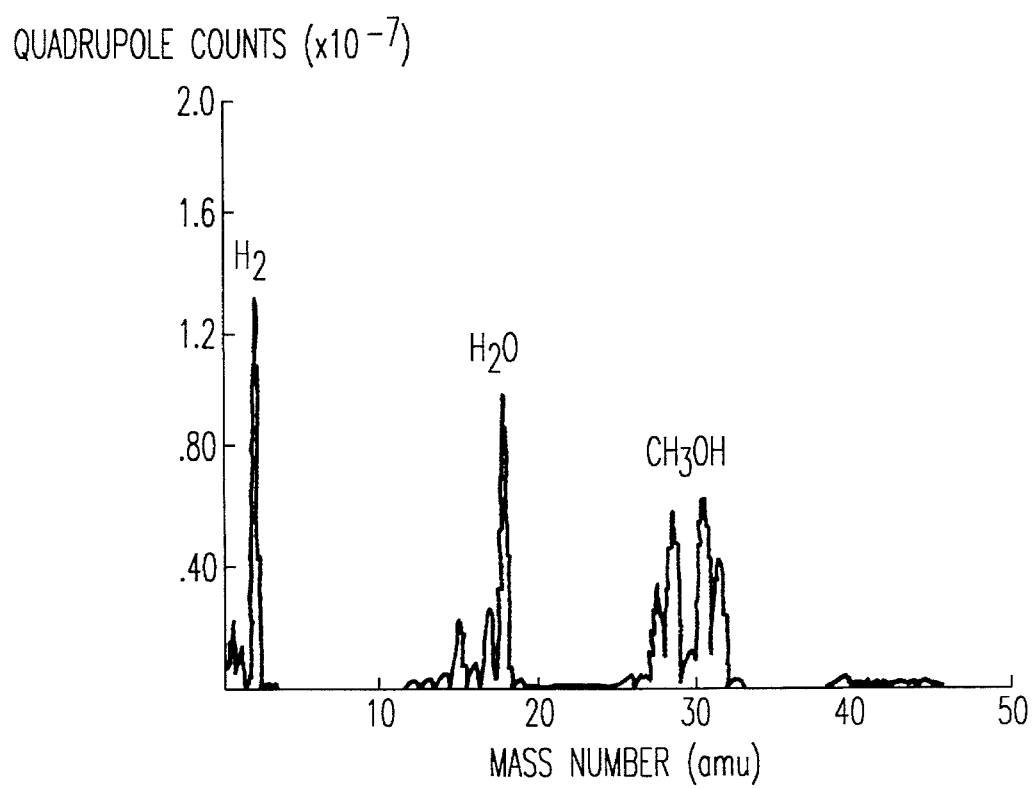
FIG. 16 is a Quadrupole mass spectrum showing the partial conversion of the same water methanol solution as it flows by a W filament at 1700° C. in the apparatus depicted in FIG. 14. The filament only has a limited lifetime due to W consumption by oxidation/sublimation.
Figure 17:
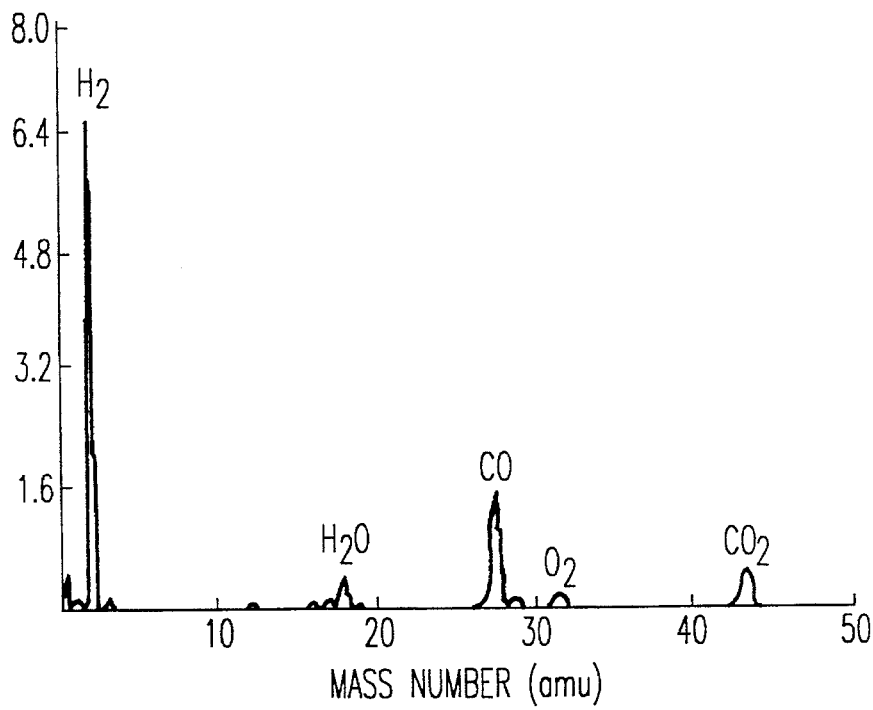

In the apparatus shown in FIG. 14, the hot-filament showed little gas conversion as compared to rf induction plasmas used according in the present invention. FIG. 15 is a mass spectrum taken by the quadrupole sampling the water-methanol reactant feed with the filament cold and the plasma off. FIG. 16 is a mass spectrum taken by the quadrupole when the water-methanol feed stock passed a hot W-filament (1700° C.). And, FIG. 17 is a mass spectrum taken by the quadrupole when the water-methanol feed stock passed through the rf plasma. These figures show the efficiency with which gas is converted. They show the deficiency of the hot-filament for gas conversion. The rf plasma totally converted the alcohol and reduced the water concentration to 10% of its original value, and hence the water vapor constituted only 5% of the total pressure. The hot-filament showed only modest conversion of the alcohol to CO and only reduced the water to 60% of its original value, and hence the water vapor constituted 30% of the total pressure. Thus, the rf plasma practice of the present invention was far more efficient in converting the input feed stock. More importantly, the conversion reduced the reactive oxygen concentration available to the diamond growth surface by transference of oxygen on water to oxygen on CO. Contrast the small spatial conversion zone of a hot-filament to the large spatial conversion zone of the low pressure plasma preferred embodiment of the present invention. The low pressure rf-plasma occupies an extensive volume of the reaction vessel. Outside the high density plasma, there exists a low density plasma. The low density plasma is effectively hot enough to complete or nearly complete conversion prior to the reactant species entering the high density plasma region wherein diamond is produced. In the current apparatus, the low density rf plasma occupies the entire cross section of the reaction tube. Feed stock gas entering the reactor traverses the low density and high density plasma before arriving at the substrate.

Figure 18:
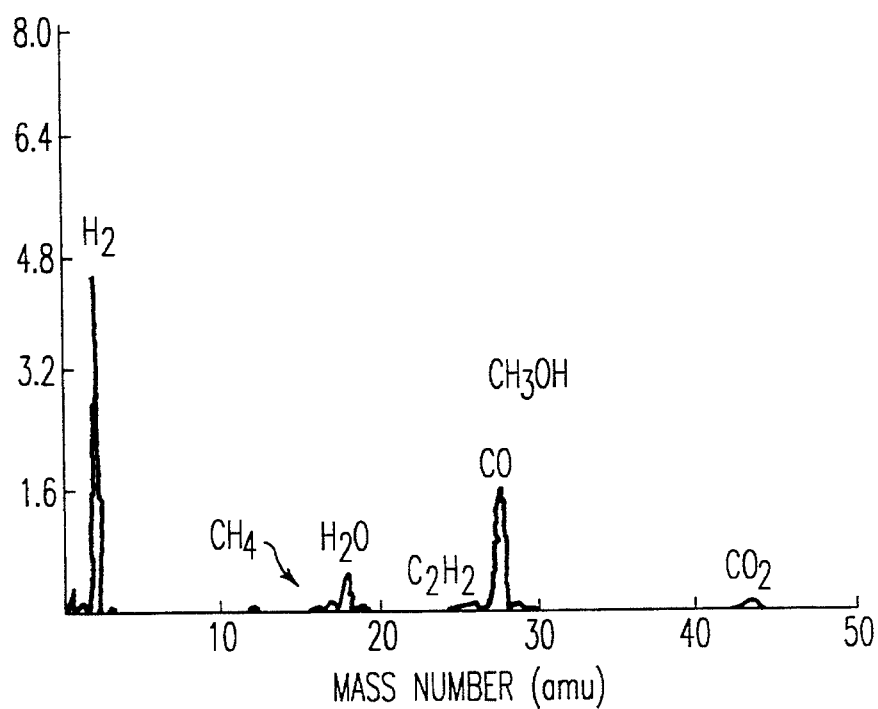
FIG. 18 is a Quadrupole mass spectrum showing $O_2$ elimination and nearly entire conversion of the water/methanol mixture as the mixture flows through the apparatus depicted in FIG. 14 with the rf plasma on and with a graphite substrate support.

Note that in FIG. 17 not enough carbon was supplied to the reactor to complete transference of the oxygen to CO. Excess oxygen as evidenced by the presence of $O_2$ was present under these conditions. Growth of diamond under these conditions was not possible. The present inventors attempted diamond growth under these conditions by introducing samples to the atomization zone on a molybdenum carrier which did not contribute carbon to the deposition process. Indeed, diamond growth proceeds in the invention apparatus only under conditions wherein $O_2$ production is not apparent. FIG. 18 is one such condition. In FIG. 18, additional carbon to eliminate $O_2$ production was supplied by gasification of the graphite substrate support, used in this experiment instead of the molybdenum carrier.

A relative figure of merit has developed in this work. In the absence of available carbon, conversion of the water produces $H_2$ and $O_2$ (as evidenced by the thermodynamic calculations of Lede). Once enough carbon is supplied to the reaction, $O_2$ is no longer observed as a gaseous by-product. Rather, CO is the primary product with $C_2H_2$ production occurring as excess carbon is supplied beyond the amount necessary to eliminate $O_2$ production. High quality diamond growth occurs under conditions in which the converted gas stock contains ~⅕ as much $C_2H_2$ as CO. The appearance of $C_2H_2$ in the downstream gas flow indicates that the thermodynamic system is saturated with respect to molecules with carbon atoms (CO, $CH_4$).

COMPARATIVE EXAMPLE 5

Work by the inventors using high concentrations of water vapor in the gas phase has shown that W filaments are rapidly consumed at elevated temperatures by the water vapor. These experiments occurred during the work of Comparative Example 4. In one experiment, a pure W filament in a mixture of ~50% water and 50% methanol (gas phase) expired before its temperature reached 1200° C. In another experiment, a carbonized W-filament eroded at ~1 mil/min in the same atmosphere at 1700° C. Thus, the 15 mil diameter filament was not sustained at 1700° C. for more than 15 min. Without conversion of the feed stock gas prior to introduction to the hot-filament system, the hot filament was riddled with filament erosion problems.

COMPARATIVE EXAMPLE 6

In prior work, Komaki used water-based solutions without any means to insure adequate conversion of the $H_2O$ to $H_2$ and CO (see Komaki Jap. Pat. Kokai Sho 6211987]-180060). The filament occupied only a small fraction of the reactor volume. Input water-ethanol feed stock interacted partially with the heated filament while other feedstock completely bypassed the hot-filament zone. Without conversion and hence without transference of oxygen from the $H_2O$ molecule to CO, this work suffered from oxygen poisoning of the growth process.

Figure 19:
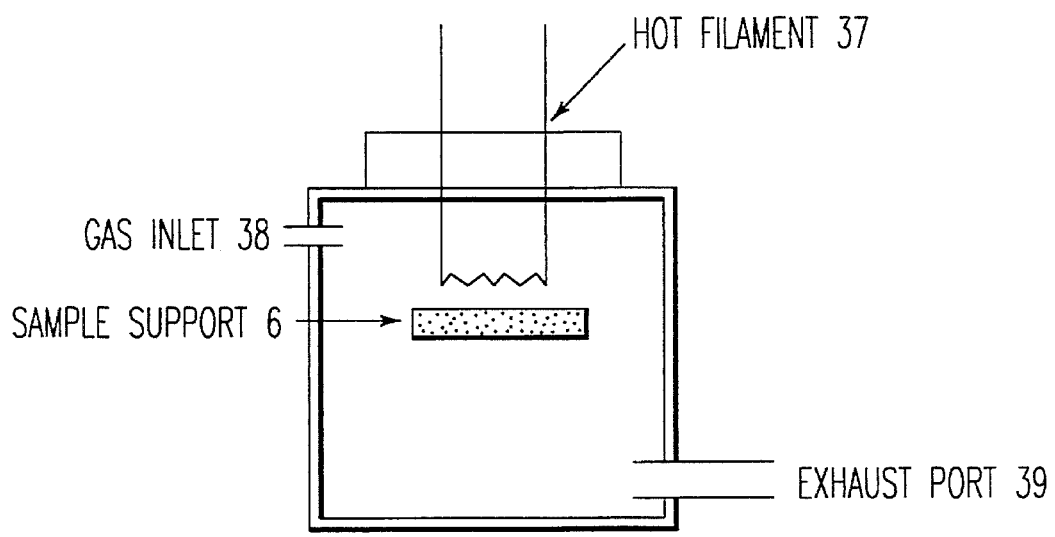
FIG. 19 is a schematic of a hot filament system used by the present inventors to attempt diamond growth following the practice of Komaki.
Figure 20:
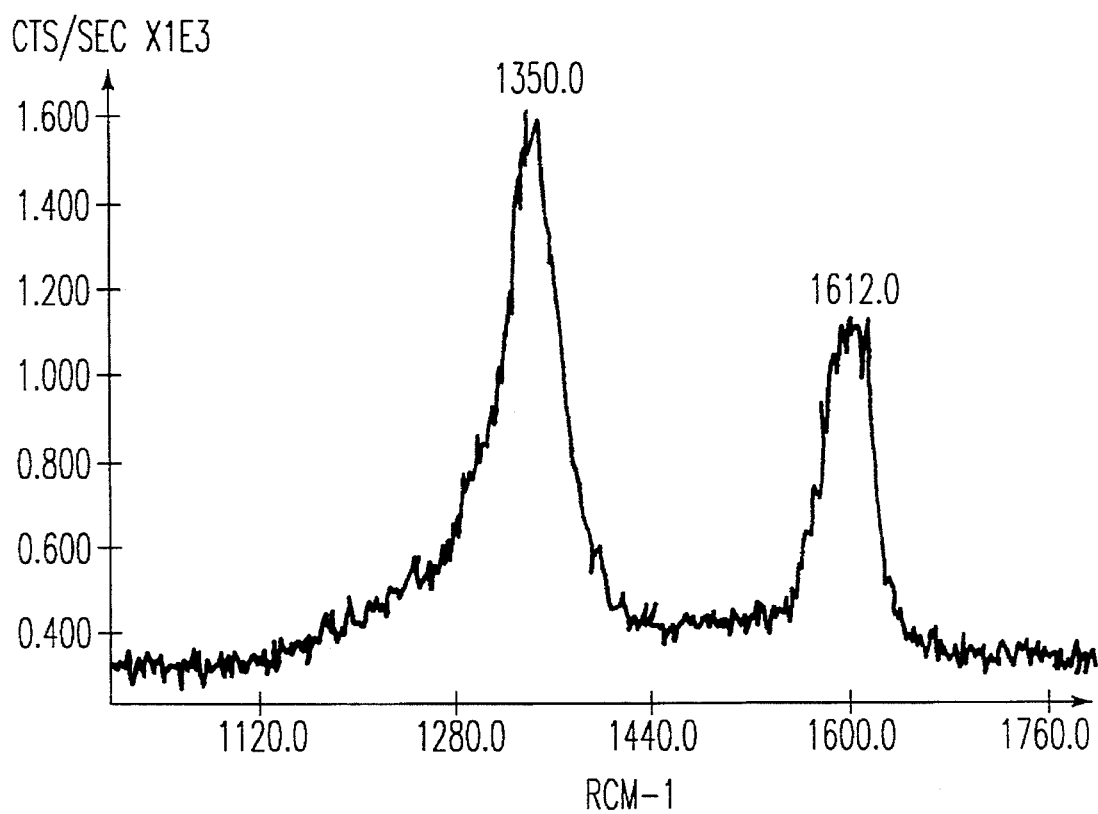
FIG. 20 is a Raman spectrum from a sample deposited from the apparatus depicted in FIG. 19. The sample showed no evidence for a 1332 $cm^{-1}$ Raman line indicative of diamond.

Work by the present inventors with simple W-filaments (as practiced by Komaki) has not produced diamond growth. The inventors have repeated the "Example #2" of the Komaki patent application under the following conditions:
1 80 Torr,
2 W filament 2100° C.,
3 40 sccm ethanol,
4 18 sccm water,
5 substrate: diamond polished Si with 1 μm paste,
6 substrate temperature: 650° C.
The work by the present inventors was performed in the chamber shown in FIG. 19. The chamber with dimensions 10 cm×10 cm×10 cm was employed with a tungsten filament (37) located ~2 mm from the substrate resting on a support (6). Gasses were metered into the chamber through a gas inlet (38) by mass flow controllers independently controlling the water and alcohol feed. The gasses were exhausted through an exhaust prot (39). The conditions listed above were established and held constant for 1 hour. The inventors did not produce diamond material in comparative example 6. A carbonaceous deposit was found with significant W contamination. XPS surface analysis shows 5% W on the film surface along with major components carbon, silicon and oxygen. Photoelectron loss structure from the carbon 1s photoelectron showed the material to have significant $sp^2$ character with no evidence for diamond. SEM photographs showed a very fine grain material, not indicative of highly crystalline material. Raman analysis revealed the material to be fine grain graphite with a large disordered graphite peak at 1360 $cm^{-1}$. FIG. 20 shows the Raman spectrum from this sample.

Obviously, numerous modifications and variations of the present invention as described herein are possible in light of the above teachings. It is therefore to be understood that within the scope of the appended claims, the invention may be practiced other than as specifically recited therein.

What is claimed as new and desired to be secured by Letters Patent of the United States is:

1. A water-based process for depositing a diamond film on a surface of a substrate, comprising:

providing a deposition apparatus including an inlet, a conversion zone coupled to the inlet, a dissociation zone coupled to said conversion zone, a deposition zone in which said disposition zone is disposed, and an outlet;

introducing a feedstock gas phase mixture constituting by gas volume percentage at least 20% water and a carbon precursor containing compound into said inlet at a flow rate so that there is a net flow of said mixture through said conversion zone and a net flow through said dissociation zone, past said substrate in the deposition zone, and through said outlet;

reacting said mixture as said mixture flows through said conversion zone to produce reactant species saturated with respect to molecules containing carbon atoms and including $H_2$, CO, $C_2H_2$, $CH_4$ with some residual water and substantially no $O_2$, said reactant species flowing to said dissociation zone;

dissociating the reactant species produced in said reacting step in the dissociation zone to produce OH species, H species and carbon species; and supplying the dissociated reactant species to said substrate in said deposition zone to produce said diamond film on the surface of said substrate.

2. A process according to claim 1, wherein said reacting step comprises:

forcing said feedstock gas mixture through said conversion zone without circumvention of said conversion zone by said feedstock gas mixture.

3. A process according to claim 2, wherein, said reacting step comprises generating a plasma for reacting the water-based feedstock gas mixture to said reactant species; and said dissociating step comprises generating a plasma at a greater density than the plasma generated in said reacting step.

4. A water-based process according to claim 1, wherein said dissociating step comprises:

energizing the reactant species by application of energy from a source selected from the group consisting of an rf source, a microwave source, a dc plasma source, a dc arc jet source and a hot filament.

5. A process according to claim 4, wherein said dissociating step comprises:

energizing the reactant species in a confined rf plasma discharge.

6. A process according to claim 1, comprising:

selecting an amount of said carbon precursor containing compound to yield a C/O ratio in a gas phase from 0.40 to 0.80.

7. A process according to claim 1, wherein said introducing step comprises:

introducing said feedstock gas phase mixture with a water gas volume percentage of 40–80%.

8. A process according to claim 1, comprising:

selecting an alcohol as said carbon precursor containing compound.

9. A process according to claim 6, comprising:

selecting an alcohol as said carbon precursor containing compound.

10. A process according to claim 9, wherein said alcohol is selected from the group consisting of methanol, ethanol and isopropanol.

11. A water-based process according to claim 1, comprising:

selecting a hydrocarbon as said carbon precursor containing compound.

12. A water-based process according to claim 6, comprising:

selecting a hydrocarbon as said carbon precursor containing compound.

13. A water-based process according to claim 1, comprising:

supplementing the water in said gas phase mixture with an acid selected from the group consisting of an organic acid, and an inorganic acid, thereby to enhance atomic H production.

14. A water-based process according to claim 1, comprising:

supplementing the water in said gas phase mixture with hydrogen peroxide.

15. A water-based process according to claims 1, comprising:

supplementing the water in said gas phase mixture with hydrazine to enhance atomic H production.

16. A process according to claim 6, wherein said reacting step comprises:

producing said feedstock gas phase mixture with a water volume percentage of 40–80%.

17. A process according to claim 16, comprising:

selecting an alcohol as said carbon precursor containing compound.

18. A process according to claim 17, wherein said alcohol is selected from the group consisting of methanol, ethanol and isopropanol.

19. A water-based process according to claim 16, comprising:

selecting a hydrocarbon as said carbon precursor containing compound.

20. A water-based process according to claim 16, comprising:

supplementing the water in said gas phase mixture with an acid selected from the group consisting of an organic acid, a chlorinated organic acid and an inorganic acid, thereby to enhance atomic H production.

21. A water-based process according to claim 16, comprising:

supplementing the water in said gas phase mixture with hydrogen peroxide.

22. A water-based process according to claims 16, comprising:

supplementing the water in said gas phase mixture with hydrazine to enhance atomic H production.

23. A water-based process according to claim 1, deposition zone:

maintaining said substrate between 55° to 1100° C. and at a pressure between 0.005 to 760 Torr.

24. A water-based process according to claim 6, comprising:

maintaining said disposition zone between 55° to 1100° C. and at a pressure between 0.005 to 760 Torr.

25. A water-based process according to claim 7, comprising:

maintaining said deposition zone between 55° to 1100° C. and at a pressure between 0.005 to 760 Torr.

26. A water-based process according to claim 16, comprising:

maintaining said deposition zone between 55° to 1100° C. and at a pressure between 0.005 to 760 Torr.

27. A water-based process according to claim 17, comprising:

maintaining said deposition zone between 55° to 1100° C. and at a pressure between 0.005 to 760 Torr.

28. A water-based process according to claim 18, comprising:

maintaining said deposition zone between 55° to 1100° C. and at a pressure between 0.005 to 760 Torr.

29. A water-based process according to claim 19, comprising:

maintaining said deposition zone between 55° to 1100° C. and at a pressure between 0.005 to 760 Torr.

30. A water-based process according to claim 20, comprising:

maintaining said deposition zone between 55° to 1100° C. and at a pressure between 0.005 to 760 Torr.

31. A water-based process according to claim 21, comprising:

maintaining said deposition zone between 55° to 1100° C. and at a pressure between 0.005 to 760 Torr.

32. A water-based process according to claim 22, comprising:

maintaining said deposition zone between 55° to 1100° C. and at a pressure between 0.005 to 760 Torr.

33. A water-based process according to claim 23, wherein said disposition zone is maintained at a temperature between 250° to 1000° C. and at a pressure between 0.3 to 5 Torr.

34. A water-based process according to claim 24, wherein said disposition zone is maintained at a temperature between 250° to 1000° C. and at a pressure between 0.3 to 5 Torr.

35. A water-based process according to claim 25, wherein said deposition zone is maintained at a temperature between 250° to 1000° C. and at a pressure between 0.3 to 5 Torr.

36. A water-based process according to claim 26, wherein said disposition zone is maintained at a temperature between 250° to 1000° C. and at a pressure between 0.3 to 5 Torr.

37. A water-based process according to claim 27, wherein said disposition zone is maintained at a temperature between 250° to 1000° C. and at a pressure between 0.3 to 5 Torr.

38. A water-based process according to claim 28, wherein said disposition zone is maintained at a temperature between 250° to 1000° C. and at a pressure between 0.3 to 5 Torr.

39. A water-based process according to claim 29, wherein said disposition zone is maintained at a temperature between 250° to 1000° C. and at a pressure between 0.3 to 5 Torr.

40. A water-based process according to claim 30, wherein said disposition zone is maintained at a temperature between 250° to 1000° C. and at a pressure between 0.3 to 5 Torr.

41. A water-based process according to claim 31, wherein said disposition zone is maintained at a temperature between 250° to 1000° C. and at a pressure between 0.3 to 5 Torr.

42. A water-based process according to claim 32, wherein said disposition zone is maintained at a temperature between 250° to 1000° C. and at a pressure between 0.3 to 5 Torr.

43. The process according to claim 1, wherein in said reacting step ~⅕ as much $C_2H_2$ as CO is produced.

44. The process according to claim 13, comprising:

supplementing the water in the gas phase mixture with a chlorinated organic acid.

45. A water-based process for depositing a diamond film on a surface of a substrate, comprising:

providing a deposition apparatus including an inlet, a conversion zone coupled to the inlet, a dissociation zone coupled to said conversion zone, a deposition zone including a carbon source and in which said disposition zone is disposed, and an outlet;

introducing a feedstock gas phase mixture constituting by gas volume percentage at least 20% water and a carbon precursor containing compound into said inlet at a flow rate so that there is a net flow of said mixture through said conversion zone and a net flow through said dissociation zone, past said substrate in the deposition zone, and through said outlet;

reacting said mixture as said mixture flows through said conversion zone to produce reactant species including $H_2$, CO, $CH_4$ with some residual water and substantially no $O_2$, said reactant species flowing to said dissociation zone;

dissociating the reactant species produced in said reacting step in the dissociation zone to produce OH species, H species and carbon species; and supplying the dissociated reactant species to said substrate in said deposition zone to react with said carbon source so that $C_2H_2$ and substantially no $O_2$ is produced and the dissociated reactant species are saturated with respect to molecules containing carbon atoms to produce said diamond film on the surface of said substrate.

46. The process according to claim 45, wherein ~⅕ as much $C_2H_2$ as CO is produced in said deposition zone.

* * * * *